United States Patent
Nishizawa et al.

(10) Patent No.: US 7,669,773 B2
(45) Date of Patent: Mar. 2, 2010

(54) IC CARD MODULE

(75) Inventors: Hirotaka Nishizawa, Fuchu (JP);
Takashi Totsuka, Machida (JP); Kenji Osawa, Hachioji (JP); Junichiro Osako, Kodaira (JP); Tamaki Wada, Higashimurayama (JP); Michiaki Sugiyama, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 299 days.

(21) Appl. No.: 11/907,911

(22) Filed: Oct. 18, 2007

(65) Prior Publication Data
US 2008/0257967 A1    Oct. 23, 2008

Related U.S. Application Data

(63) Continuation of application No. 11/125,197, filed on May 10, 2005, now Pat. No. 7,296,754.

(30) Foreign Application Priority Data
May 11, 2004 (JP) .............................. 2004-140699

(51) Int. Cl.
G06K 19/06  (2006.01)
G06K 7/06   (2006.01)
G06K 5/00   (2006.01)
(52) U.S. Cl. .................. 235/492; 235/380; 235/441
(58) Field of Classification Search .................. 235/380, 235/492, 441; 361/679.32, 686, 684, 737, 361/637; 711/115, 163, 103; 257/777, 686, 257/678; 365/63, 185.01, 195, 185.11; 455/558, 455/557
See application file for complete search history.

(56) References Cited
U.S. PATENT DOCUMENTS
4,532,419 A * 7/1985 Takeda ........................ 235/492
4,794,243 A * 12/1988 Hamada ...................... 235/492
5,185,516 A *  2/1993 Saito .......................... 235/380
5,208,450 A *  5/1993 Uenishi et al. ............... 235/492
5,621,685 A    4/1997 Cernea et al. ........... 365/185.18
5,787,493 A *  7/1998 Niijima et al. ............... 711/204

(Continued)

FOREIGN PATENT DOCUMENTS
JP           10-334205         12/1998

OTHER PUBLICATIONS
English abstract of WO 01/84490, Nov. 8, 2001 (corresponds to Document AA).

Primary Examiner—Thien M. Le
Assistant Examiner—Thien T Mai
(74) Attorney, Agent, or Firm—Miles & Stockbridge P.C.

(57) ABSTRACT

To realize compatibility with an SIM card and adaptation to a high-speed memory access in an IC card module having a microcomputer and a memory card controller. An IC card module includes a plurality of first external connecting terminals and a plurality of second external connecting terminals both exposed to one surface of a card substrate, a microcomputer connected to the first external connecting terminals, a memory controller connected to the second external connecting terminals, and a volatile memory connected to the memory controller. The shape of the card substrate and the layout of the first external connecting terminals are based on a standard of plug-in UICC of ETSI TS 102 221 V4.4.0 (2001-10) or have compatibility. The second external connecting terminals are disposed outside the minimum range of the terminal layout based on the standard for the first external connecting terminals. The first and second external connecting terminals respectively include signal terminals electrically separated from one another.

21 Claims, 15 Drawing Sheets

U.S. PATENT DOCUMENTS

| | | | |
|---|---|---|---|
| 5,864,463 A * | 1/1999 | Tsukada et al. | 361/679.32 |
| 6,669,487 B1 | 12/2003 | Ishihara et al. | 439/60 |
| 6,836,021 B2 * | 12/2004 | Ishikawa et al. | 257/777 |
| 6,917,544 B2 | 7/2005 | Maayan et al. | 365/185.33 |
| 6,945,465 B2 * | 9/2005 | Nishizawa et al. | 235/492 |
| 6,981,068 B1 | 12/2005 | Harari et al. | 710/2 |
| 7,120,029 B2 | 10/2006 | Nishizawa et al. | 361/737 |
| D556,764 S * | 12/2007 | Nishizawa et al. | D14/436 |
| D581,932 S * | 12/2008 | Nishizawa et al. | D14/436 |
| 7,552,876 B2 * | 6/2009 | Nishizawa et al. | 235/492 |
| 2001/0006901 A1 | 7/2001 | Ryu | 455/558 |
| 2002/0170974 A1 | 11/2002 | Kashima | 235/492 |
| 2003/0066881 A1 | 4/2003 | Maenpaa et al. | 235/380 |
| 2003/0160102 A1 | 8/2003 | Yoshimoto et al. | 235/492 |
| 2003/0234294 A1 * | 12/2003 | Uchihiro et al. | 235/492 |
| 2004/0031857 A1 * | 2/2004 | Sato | 235/492 |
| 2004/0058705 A1 | 3/2004 | Morgan et al. | 455/556.1 |
| 2004/0089717 A1 | 5/2004 | Harari et al. | 235/441 |
| 2004/0177216 A1 | 9/2004 | Asari et al. | 711/103 |
| 2004/0210715 A1 | 10/2004 | Harari et al. | 711/115 |
| 2004/0232247 A1 | 11/2004 | Tsunoda et al. | 235/492 |
| 2005/0021875 A1 | 1/2005 | Bouthemy et al. | 709/250 |
| 2005/0099269 A1 | 5/2005 | Diorio et al. | 340/10.51 |
| 2005/0157568 A1 | 7/2005 | Teicher | 365/195 |
| 2005/0181875 A1 | 8/2005 | Hoehne et al. | 463/41 |
| 2005/0191993 A1 | 9/2005 | Laumen et al. | 455/412.1 |

* cited by examiner

IC CARD MODULE

CROSS-REFERENCE TO RELATED APPLICATIONS

The present application is a continuation of application Ser. No. 11/125,197 filed May 10, 2005 now U.S. Pat. No. 7,296,754, and claims priority from Japanese patent application No. 2004-140699 filed on May 11, 2004, the content of which is hereby incorporated by reference into this application.

BACKGROUND OF THE INVENTION

The present invention relates to an IC card module having a multifunction, which is based on a standard such as plug-in UICC (Universal Integrated Circuit Card) or USIM (Universal Subscriber Identity Module) or the like or has compatibility with those standards.

A multifunction memory card in which a card substrate based on a MMC card (MultiMediaCard) or SD card standard is equipped with an SIM (Subscriber Identity Module) card unit together with a memory card unit, has been described in a patent document 1. Connector terminals provided in the card substrate are disposed in zigzags in two rows and provided with compatibility with an MMC card or SD card. Incidentally, MultiMediaCard is a trademark of Infineon-TechnologiesAG. It is also abbreviated as "MMC".

An IC card wherein a microcomputer for the IC card is mounted to a base card and contact terminals for obtaining access to the microcomputer are formed in the surface of the base card and wherein a flash memory and contact terminals for obtaining access to the flash memory are added thereto, has been described in a patent document 2. In the IC card, the base card is equivalent to the size of a credit card of 54 mm×86 mm×0.76 mm. The contact terminals for obtaining access to the IC card microcomputer meet a standard for terminal positions and functions, based on ISO/IEC 7816-2. The contact terminals for obtaining access to the flash memory respectively have a size and a layout based on a standard of a memory card like a smart card.

[Patent Document 1] International Patent Publication No. 01/84490, Pamphlet

[Patent Document 2] Japanese Unexamined Patent Publication No. Hei 10 (1998)-334205

SUMMARY OF THE INVENTION

In the present invention, an IC card module suitable for a mobile communication system, which is typified by a three-generation cellular phone based on the standard such as the plug-in UICC or USIM or the like or having compatibility, has been discussed. This type of IC card module aims to make it possible to take up and use a telephone number and account information as they are by using a common IC card module by its replacement even in the case of phones different in type and is intended for all the three-generation cellular phones. This type of card substrate is set to 15 mm×25 mm×0.75 mm in a manner similar to the SIM card as described in the plug-in UICC standard at ETSI TS (European Telecommunications Standardization Institute Technical Specification) 102 221 V4.4.0 (2001-10). External interface terminals for a microcomputer are arranged in the surface of the card substrate in relatively large patterns based on the standard for the terminal positions and functions, based on ISO/IEC 7816-2. The present inventors have discussed in particular that a multifunction is realized using this type of IC card to cope with a case free of the need for such an extent as to additionally provide a memory module in the microcomputer although an on-chipped non-volatile memory is small in storage capacity and is not enough for storing telephone-directory data and contents data. In brief, this type of IC card module is equipped with a memory storage function, e.g., a memory card function.

It is however difficult to make compatible the fact that the interface with the microcomputer is caused to meet the standard for the terminal positions and functions, based on ISO/IEC 7186-2 and the fact that the interface terminals with the memory card function are caused to meet a terminal standard inherent in its function. This is because since the card substrate is small in size, both standards cannot be satisfied. Since the card size is large in the technique disclosed in the patent document 2, both standards can be easily satisfied. With a view toward satisfying both standards, it is possible to cope with it by separately disposing the interface terminals for the two on the obverse and reverse sides of the card substrate, reducing the size of each interface terminal for one of them, and changing the array of the interface terminals for one of them. It is however important to decide the above with full consideration of its interest and merits/demerits.

An object of the present invention is to contribute to compatibility with an SIM card, high reliability of data processing by a microcomputer, adaptation to the speeding up of a memory access and adaptability to diversification of a memory interface function in an IC card module having a multifunction of an interface function and the memory interface function of the microcomputer.

The above, other objects and novel features of the present invention will become apparent from the description of the present specification and the accompanying drawings.

Summaries of representative ones of the inventions disclosed in the present application will be explained in brief as follows:

An IC card module according to the present invention includes [a] a plurality of first external connecting terminals (11) and a plurality of second external connecting terminals (12) both exposed to one surface of a card substrate, a microcomputer connected to the first external connecting terminals, a memory controller connected to the second external connecting terminals, and a non-volatile memory connected to the memory controller. [b] The shape of the card substrate and the layout of the first external connecting terminals are based on a standard of plug-in UICC at ETSI TS 102 221 V4.4.0 (2001-10) or have compatibility. [c] The second external connecting terminals are disposed outside a minimum range of the terminal layout based on the standard for the first external connecting terminals. [d] The first external connecting terminals and the second external connecting terminals respectively include signal terminals electrically separated from one another.

According to the above [a], since both the first and second external connecting terminals which perform an external interface between the microcomputer and the memory controller, are formed in one surface of the memory card, there is no need to form the card substrate by a complicated multi-layer wiring board. Thus, a rise in the cost of the card substrate is held down. When the terminals that respectively meet the standard, are formed in the obverse and reverse sides of the card substrate, the cost thereof rises. According to the above [b], since interface terminals of the microcomputer have arrangements and sizes similar to an SIM card, it is easy to take compatibility with the SIM card. Since the interface terminals of the microcomputer are not scaled down with respect to the standard of the SIM card, they contribute to high reliability of data processing by the microcomputer in terms of contact conditions of the interface terminals. This is because there is a fear that if the areas thereof are reduced, then the contact conditions are degraded. According to the above [c], it is assured to avoid the second external connecting terminals from contacting terminals of a card socket for the SIM card. In this respect, the compatibility with the SIM card can be assured. The above standard defines the minimum area for each first external connecting terminal. According to it, it is essential that the terminals of the card socket are able to have such layouts that they are contactable with the card terminals within the minimum area. Even in the above point [d], the compatibility with the SIM card can be assured. If the signal terminals of the first external connecting terminals and the second external connecting terminals are electrically separated from one another, it is then possible to completely eliminate a fear that the memory controller exerts a bad influence on a terminal such as a cellular phone capable of adapting to only an SIM card with no memory interface function. According to the above [a], [b] and [c], the second external connecting terminals are estimated to be reduced or scaled down with respect to the standard of the memory card. If it is considered that the microcomputer is used in security processing, it is essential to allow the microcomputer to meet satisfactory contact conditions in terms of reliability of the processing as mentioned above. In the case of a memory access, however, a sufficient data storage function can also be realized by making combined use of an error correction by ECC or the like, a retry access, etc. It is considered that as compared with the above, it is advisable to reduce or scale down the second external connecting terminals which perform the external interface of the memory controller, with respect to the corresponding memory card standard in that the number of parallel access data bits is increased to make room to enable a high-speed access or the like.

The card substrate may be provided with being separably formed within a card based on an outer shape of an ID-1 type card standard of ISO/IEC 7816-1.

The shape of the card substrate and the layout and functions of the first external connecting terminals can also be grasped as being based on the GSM 11.11 standard or having compatibility.

In a specific form of the present invention, the microcomputer may hold a program which realizes an SIM function if attention is paid to compatibility with the SIM card. The microcomputer may have a program which realizes a USIM function. Alternatively, the microcomputer may have a program which realizes a plug-in UICC function.

In another specific form of the present invention, the microcomputer may be authenticated by an evaluation/authentication agency of ISO/IEC 15408.

In a further specific form of the present invention, the memory controller may have a memory card interface function based on a predetermined memory card standard such as an MMC standard or an SD card standard, or having compatibility.

In a still further specific form of the present invention, the first external connecting terminals include a power supply terminal, a ground terminal, a reset terminal, a clock terminal, and an input/output terminal. The second external connecting terminals include a power supply terminal, a ground terminal, a clock terminal, a command terminal, and a data terminal of 1 bit or data terminals of plural bits. The second external connecting terminals are respectively set smaller than the first external connecting terminals.

When the microcomputer has non-contact interface portions, the non-contact interface portions are connected to terminals defined as reserve terminals of the first external connecting terminals and may be used for antenna terminals for wireless communication. Alternatively, non-contact interface portions are connected to predetermined terminals of the second external connecting terminals and may be used for antenna terminals.

In a still further specific form of the present invention, a semiconductor chip constituting the non-volatile memory has a layout in which the semiconductor chip is superimposed over the first external connecting terminals or both the first external connecting terminals and the second external connecting terminals. It has been estimated that the card substrate is small, the storage capacity of the non-volatile memory becomes relatively large, and the size of the chip becomes large.

In a still further specific form of the present invention, the memory controller has a microcomputer interface circuit which issues an operation command to the microcomputer in response to a predetermined memory card command and receives a response corresponding to the operation command. At this time, the circuit substrate may further include third external connecting terminals (16) connected to the microcomputer interface circuit. The first external connecting terminals and the third external connecting terminals are connected to one another within a card slot. Further, the second external connecting terminals are connected to a memory card host. Consequently, the IC card module may be selected so as to function as a memory card or the like capable of external interface, which is set in conformity with memory card interface specs. If the third external connecting terminals are held floating within the card slot, then a host computer is capable of performing an interface to the microcomputer via the first external connecting terminals and carrying out a memory card interface via the first external connecting terminals.

A portable terminal device according to another aspect of the present invention, having the IC card module detachably mounted thereto comprises first interface terminals which contact the first external connecting terminals respectively, second interface terminals which contact the second external connecting terminals respectively, and a data processor connected to the first and second interface terminals. If a cellular phone is assumed, there is provided a high frequency section connected to the data processor. The data processor performs a baseband process or the like.

Advantageous effects obtained by the representative one of the inventions disclosed in the present application will be explained in brief as follows:

An IC card module having a multifunction of an interface function and a memory interface function of a microcomputer is capable of contributing to compatibility with an SIM card, high reliability of data processing by the microcomputer, adaptation to the speeding up of a memory access, ensuring of a large-scale memory or a program storage area, and adaptability to diversification of a memory interface function.

DETAILED DESCRIPTION OF THE PREFERRED EMBODIMENTS

<<Terminal Layout of IC Card Module>>

Figure 1:
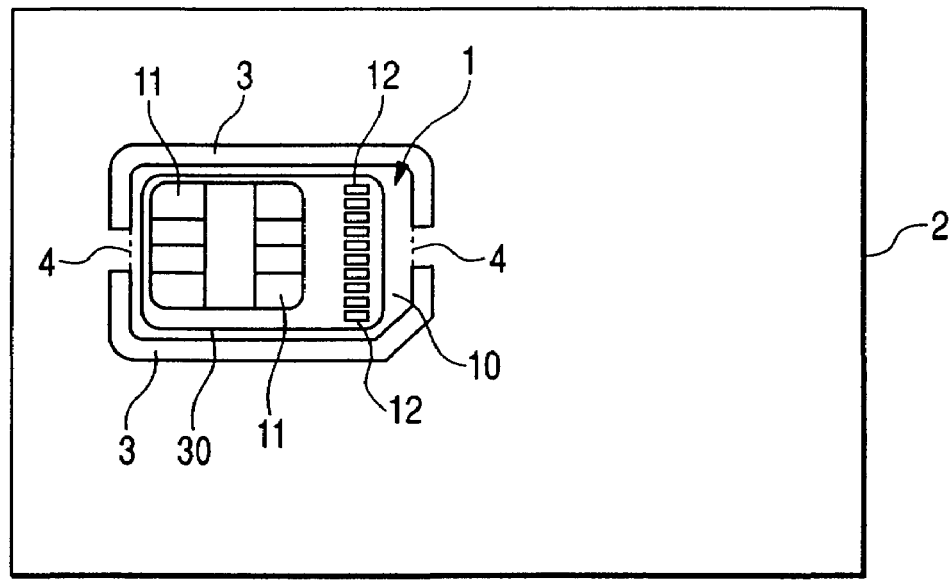
FIG. 1 is a plan view illustrating a state in which an IC card module according to the present invention is separably incorporated into an ID-1 type card.

An external appearance of an IC card module according to the present invention is illustrated in FIG. 1. Although not restricted in particular, the IC card module 1 is based on an outer shape of an ID-1 type card standard of ISO/IEC 7816-1 or separably formed within an ID card 2 having compatibility. Reference numeral 3 indicates a die-cut portion, and reference numerals 4 indicate half-cut portions. The IC card module 1 is separable from the half-cut portions 4. The IC card module 1 is configured as an IC card used in a third-generation cellular phone. A plug-in UICC card or the like configured on the basis of an SIM card widely used in a cellular phone based on a GSM standard is further expanded in function. It is equivalent to one applied and expanded to cellular phones such as 3 G, W-CDMA, CDMA2001X, etc. It is also configured as an IC card considered so as to assure even backward-compatibility with the SIM card.

Figure 2:
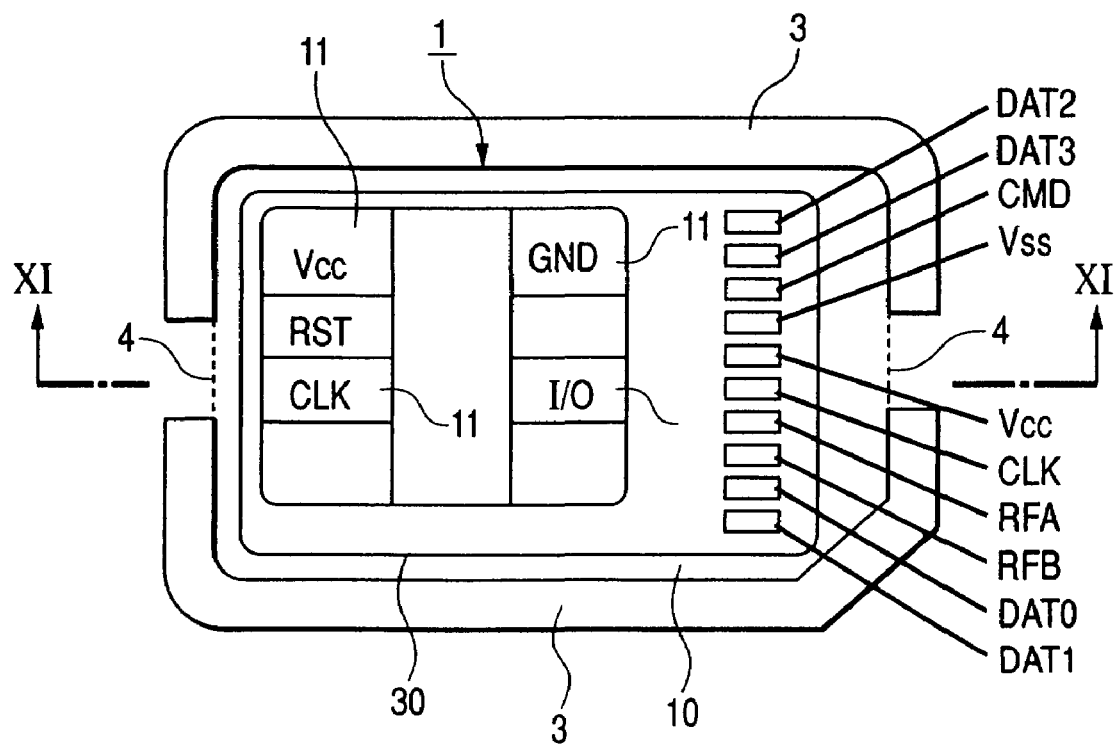
FIG. 2 is a plan view showing an outward appearance of the IC card module in further detail.

The outward appearance of the IC card module is shown in FIG. 2 in further detail. The IC card module 1 can be used by being mounted in, for example, a card slot for the SIM card of the cellular phone based on the GSM standard. The IC card module 1 includes a microcomputer (MCU) 13, a flash memory (FLASH) 15 indicative of one example of an electrically reprogrammable non-volatile memory, and a memory card controller (CNT) 14 connected to the flash memory 15 all of which are disposed on a card substrate 10, as illustrated in a block diagram of FIG. 3 (not shown in FIG. 1). A plurality of first external connecting terminals (ITFc) 11 connected to their corresponding interface terminals of the microcomputer 13, and a plurality of second external connecting terminals (ITFm) connected to their corresponding interface terminals of the memory card controller 14 are exposed from one surface of the card substrate 10.

Figure 4:
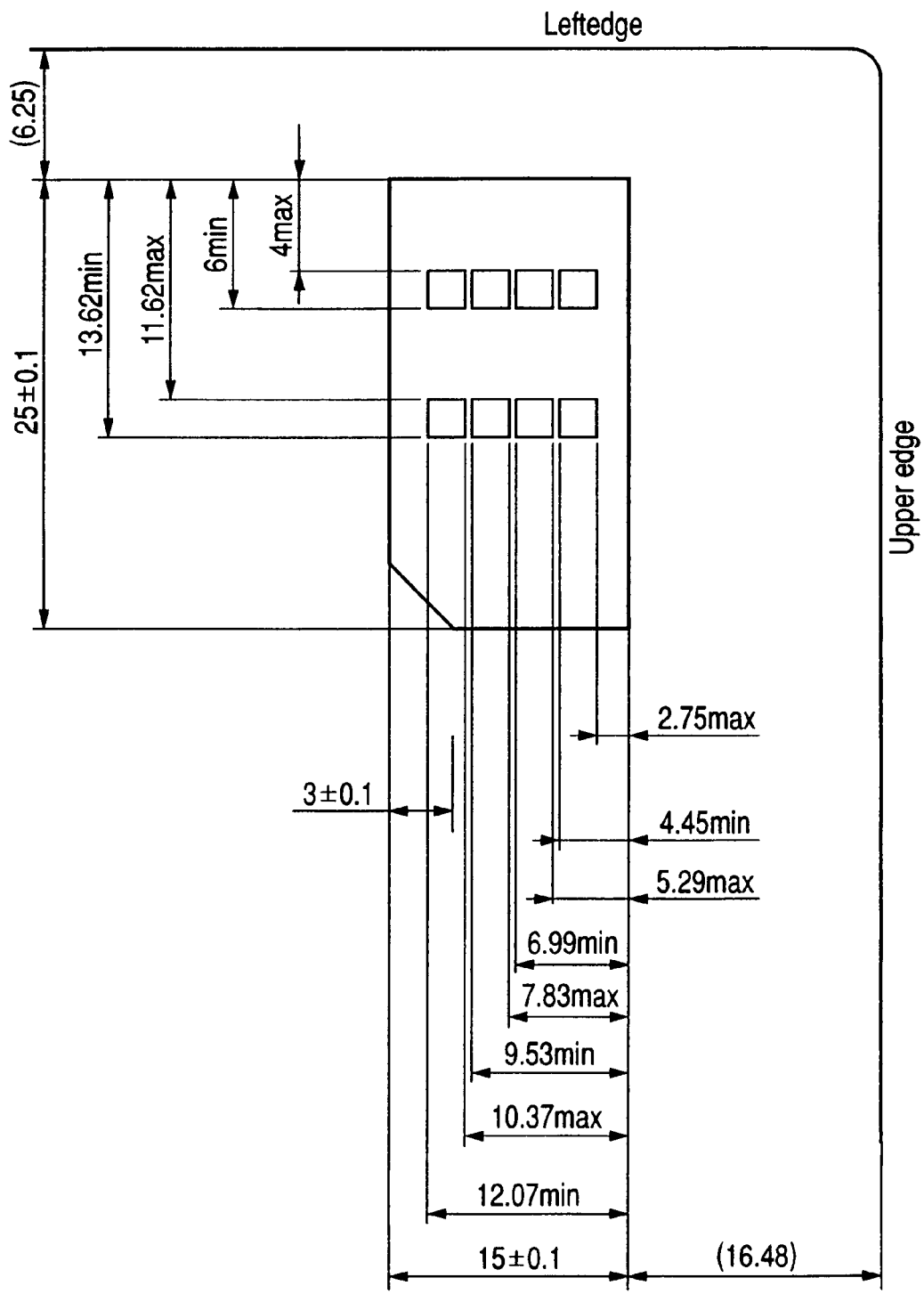
FIG. 4 is a diagram for describing an extract indicative of the shape of a card substrate under a plug-in UICC standard and standardized contents of a layout of first external connecting terminals.

The shape of the card substrate 10 and the layout and functions of the first external connecting terminals 11 have compatibility with the GSM11.11 standard. The present GSM11.11 standard is equivalent to the shape of the card substrate and the layout of the first external connecting terminals based on the plug-in UICC standard under ETSI TS 102 221 V4.4.0(2001-10). The shape of the card substrate based on the plug-in UICC standard and standardized contents of the layout of the first external connecting terminals based thereon are extracted in FIG. 4. The unit is expressed in mm. Terminal positions are defined based on the maximum distance and minimum distance as viewed from the end of the card. Although the thickness is not shown in the figures, it is defined as an average value 0.76 mm with the minimum value as 0.68 mm and the maximum value as 0.84 mm. As is apparent from FIG. 4, the present standard defines the minimum area for each first external connecting terminal 11. According to it, it is essential that terminals of a card socket are able to have such layouts that they are contactable with the first external connecting terminals 11 of the card within the minimum area. The second external connecting terminals 12 are disposed outside the minimum range for terminal layout, based on the standard for the first external connecting terminals 11. It is thus assured to avoid the second external connecting terminals 12 from contacting the terminals of the card socket for the SIM card.

The IC card module based on the GSM11.11 standard or the plug-in UICC standard is called also ID-000 type card with respect to the ID-1 type card. Physical and electrical characteristics that the ID-000 type IC card should satisfy, have been described even in a document "IRD Interface Specifications For Use With NDS Smart Card" (Jul. 4, 1999) by NDS Ltd.

The first external connecting terminals 11 include a power supply terminal (Vcc), a ground terminal (GND), a reset terminal (RST), a clock terminal (CLK) and an input/output terminal (I/O). Others are configured as non-standardized reserve terminals. The layout and functions of the first external connecting terminals 11 disposed on the ID card 2 are based even on the ISO/IEC 7816-2 standard. If a point of view is changed, then the layout and functions of the first external connecting terminals 11 on the card substrate 10 can also be grasped as having compatibility with the GSM11.11 standard.

In FIG. 2, the second external connecting terminals 12 may be determined according to memory card interface specs supported by the memory card controller 14. Consideration is given to a memory card controller having compatibility with, for example, an HS-MMC (High Speed Multi Media Card) standard. In this case, there are provided ten second external connecting terminals 12. Functions of a power supply terminal (Vcc), a ground terminal (Vss), a clock terminal (CLK), a command terminal (CMD), data terminals (DAT0 through DAT3) of 4 bits, and non-contact interface antenna terminals (RFA and RFB) used as additional function terminals are assigned thereto. An antenna is connected to the non-contact interface antenna terminals (RFA and RFB). The functions of the second external connecting terminals 12 are not limited to the above functions but may be eight terminals in total except for the non-contact interface antenna terminals (RFA and RFB). Further, the functions thereof may be five terminals in total inclusive of a 1-bit data terminal, or the like. As compared with the IC card function, the function of storing data in large capacity, and the function of inputting/outputting data at high speed are required as memory card functions. In the present embodiment, the data capacity of the flash memory 15 is greater than that of an EEPROM 23 where the flash memory 15 corresponding to a data storage chip constituting a memory card function, and an EEPROM 23 corresponding to an electrically reprogrammable data storage circuit constituting an IC card function are compared. The maximum data transfer speed related to the memory card function is larger than the maximum data transfer speed related to the IC card function. When an attempt is made to realize a high-capacity and fast data transfer as the memory card function, it is preferable that the number of terminals used in the input/output of data, of the second external connecting terminals is set larger than the number of terminals used in the input/output of data, of the first external connecting terminals, and a plurality of terminals are used to input/output data in parallel.

The first external connecting terminals 11 and the second external connecting terminals 12 are electrically separated from one another in terms of signal terminals. A power supply and/or ground may be connected in common. If the signal terminals of the first external connecting terminals 11 and the second external connecting terminals 12 are electrically separated from one another, it is then possible to completely eliminate a fear that the memory card controller exerts a bad influence on a cellular phone capable of adapting to only an SIM card with no memory interface function. It is possible to assure backward compatibility with the SIM card even in this respect.

With the supply of a ground potential (reference potential: Vss) from the ground terminal (GND) of the first external connecting terminals 11 to the memory card controller 14 and the flash memory 15, the ground terminal (GND) of the second external connecting terminals 12 may be omitted.

<<Specific Layout Conditions of Second External Connecting Terminals>>

Figure 5:
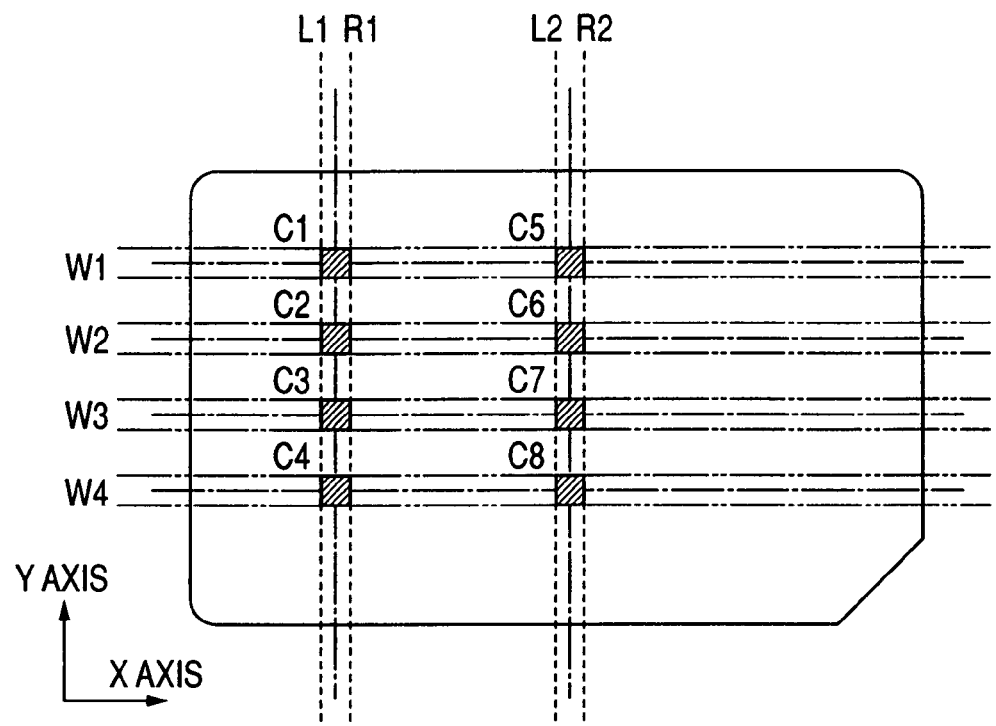
FIG. 5 is an explanatory diagram showing areas in which connector contacts of C1 through C8 of an SIM card exist.

A description will now be made of a specific example about layout conditions of the second external connecting terminals 12, for performing functional extension on the SIM card. The positions of connector contacts (contacts) on the card socket side of the ID-000 type card are defined with respect to the ID-000 type card provided in relation to the ISO 7816 or the like. This is identical to the standard shown in FIG. 4. According to it, as shown in FIG. 5, an area in which eight connector contacts of C1 through C8 corresponding to the first external connecting terminals 11 exist, should be within such a rectangular hatching area shown in FIG. 5. L1 and L2 respectively indicate left-edge limits with respect to an X-axis direction, and R1 and R2 respectively indicate right-edge limits. W1 through W4 respectively indicate width areas extending in a Y-axis direction, in which the connector contact exists.

Figure 6:
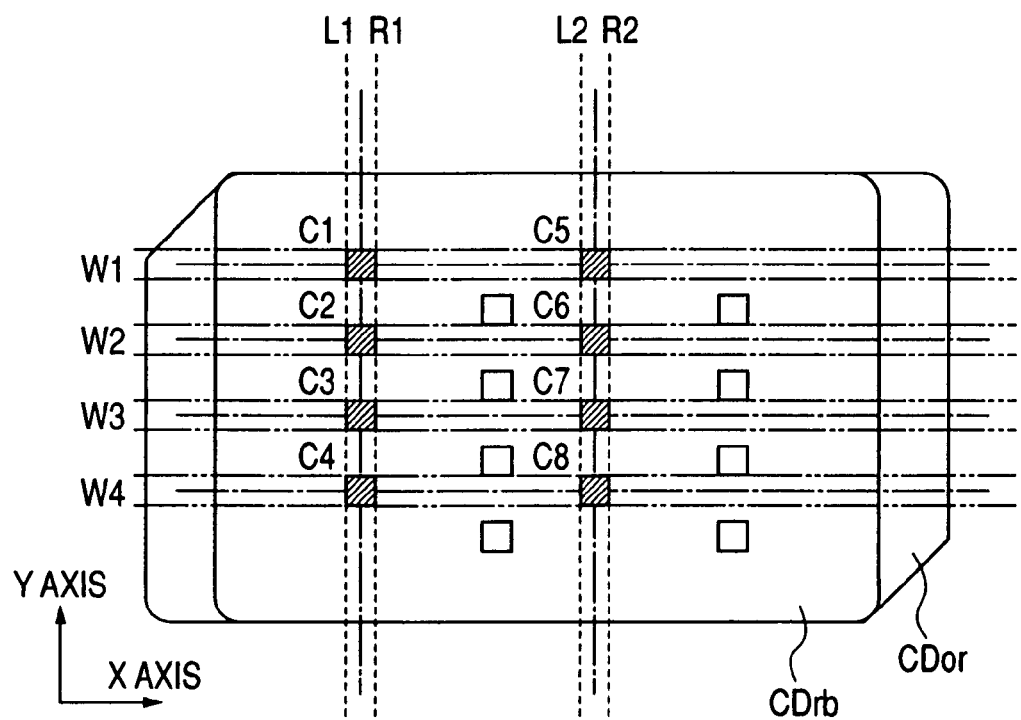
FIG. 6 is an explanatory diagram depicting areas in which the connector contacts exist in both states in which an ID-000 type card is reversely inserted into a slide insertion type card socket and normally inserted therein.

First, consideration is given to a state in which the ID-000 type card is reversely inserted into its corresponding slide insertion type card socket. A card section formed with a 45° cut-away portion is configured as a card tip as viewed in a card's normal insertion direction. When the ID-000 type card is reversely inserted into the card socket, the card is not inserted deep by an approximately 3-mm length of cut-away portion due to the restriction of 45° cutting of the card. Thus, areas in which connector contacts of a miss-inserted card (CDrb) and a normally-inserted card (CDor) exist, are represented as shown in FIG. 6 where the cards CDrb and CDor overlap each other. Here, the areas in which the connector contacts of the miss-inserted card CDrb exist, are shown in hatching-free rectangles.

Figure 7:
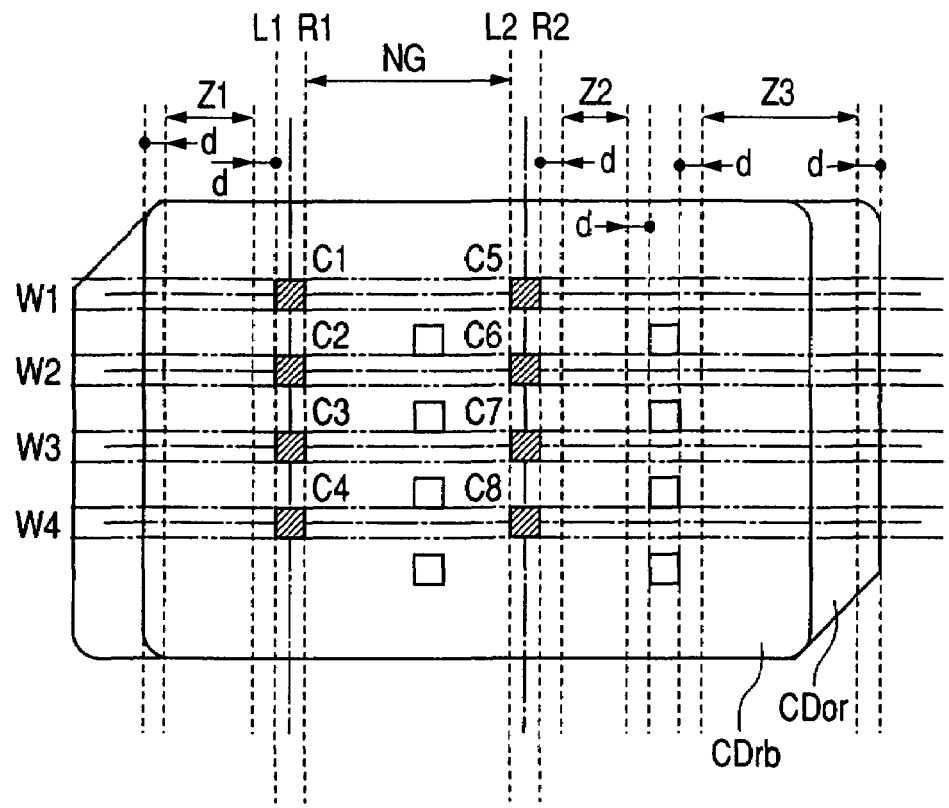
FIG. 7 is an explanatory diagram showing areas in which the connector contacts at the time that strokes d necessary to use a push-pull type card socket with respect to FIG. 6 are taken into consideration, exist.

When the slide-inserted card socket is of a push-pull type, it results in such a structure that the card socket holds a card by insertion push and ejects the card by another push. In this case, strokes (distances: d) for overrun slide by push are required. FIG. 7 shows areas in which connector contacts at the time that the strokes d are taken into consideration with respect to FIG. 6, exist. According to it, the areas in the X-axis direction in which extension terminals like the second external connecting terminals 12 can be disposed, result in areas indicated by Z1, Z2 and Z3 in FIG. 7. In the SIM card, many ground terminals GND are provided in an area indicated by NG. This is because it is considered that it is advisable to configure the area NG as an extension-terminal addition inhibiting area from the viewpoint that a fear of an undesired short is prevented before happens, where the backward compatibility with the SIM card or the like is taken into consideration.

Figure 8:
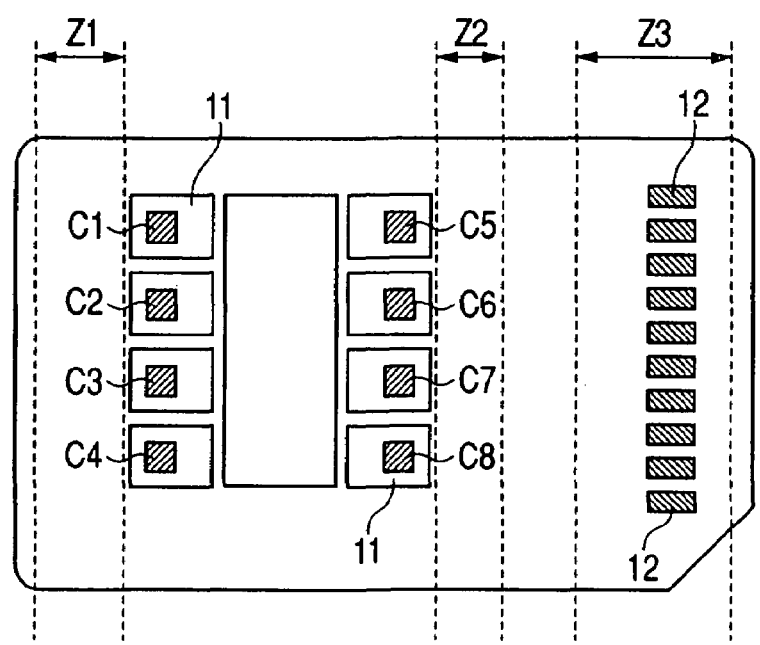
FIG. 8 is an explanatory diagram depicting an example in which ten second external connecting terminals 12 are disposed in an area of Z3 in a row.

FIG. 8 shows an example in which ten second external connecting terminals 12 are disposed in the area of Z3 in a row. In FIG. 8, an example illustrative of patterns for the first external connecting terminals is shown as one example in which they are decided by taking a margin of a distance d on the left side with respect to the existing areas of the connector contacts C1 through C4, taking a margin of a distance d on the right side with respect to the existing areas of the connector contacts C5 through C8, and taking into consideration the addition inhibiting area NG lying between the connector contacts C1 through C4 and C5 through C8.

Figure 9:
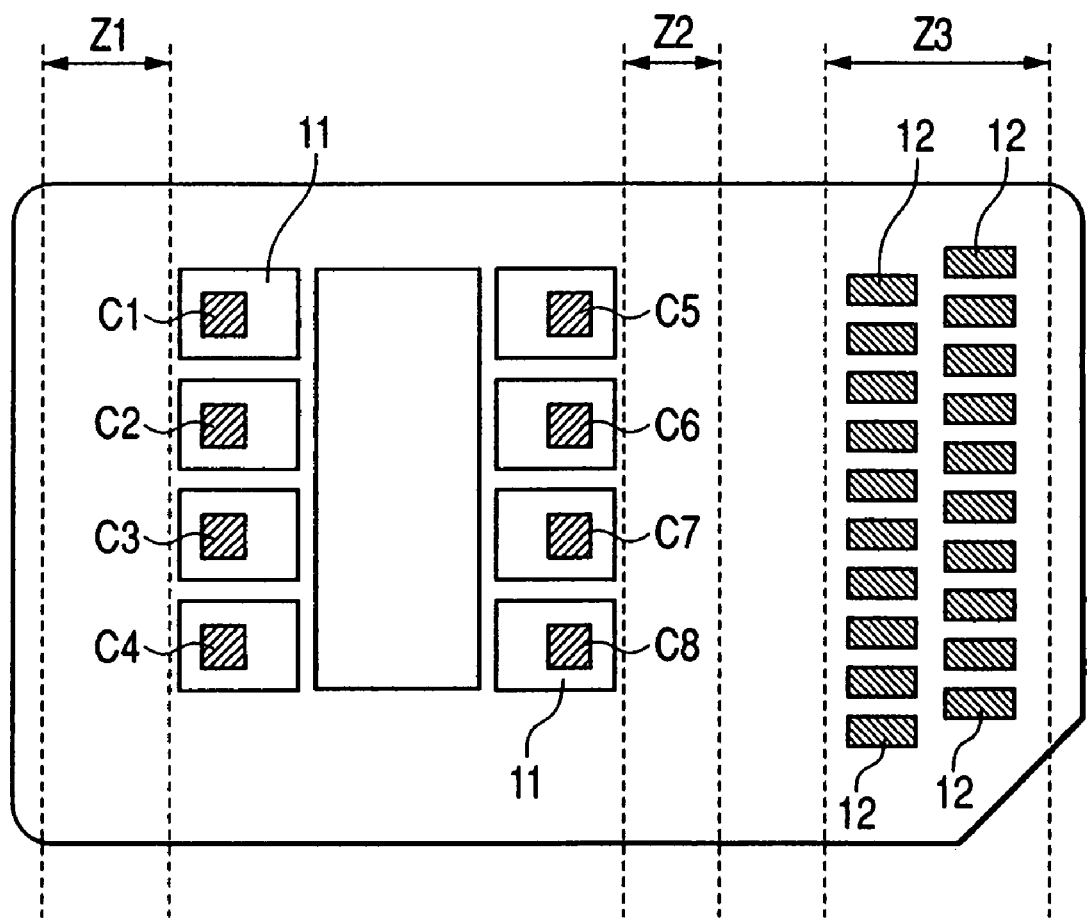
FIG. 9 is an explanatory diagram showing an example in which twenty second external connecting terminals are disposed in the area of Z3 in two rows.

FIG. 9 shows an example in which twenty second external connecting terminals 12 are disposed in the area of Z3 in two rows. In the present example, the second row lying inside the card is shifted in a downward direction as viewed from the Y axis to effectively use a cut-away portion, and a layout margin is thus taken.

<<Control Function of IC Card Module>>

Figure 3:
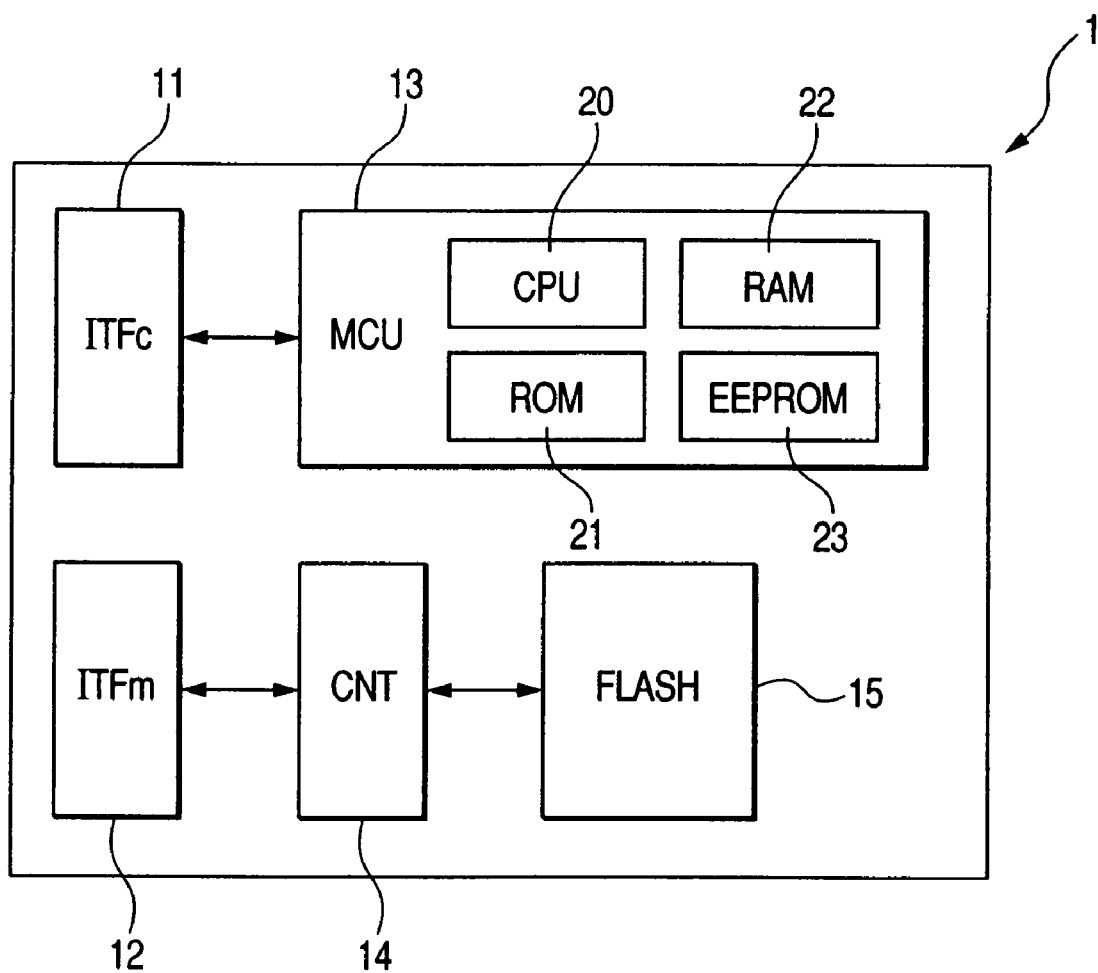
FIG. 3 is a block diagram illustrating a configuration of connections among respective circuit elements of the IC card module and external connecting terminals.

A form or configuration of connections among respective circuit elements of the IC card module and external connecting terminals is shown in a block diagram in FIG. 3. The microcomputer 13 is so called "IC card micon". The microcomputer 13 includes, for example, a central processing unit (CPU) 20, a mask ROM 21 that retains an operation program for the CPU 20, a RAM 22 used in a work area or the like of the CPU 20, and an electrically reprogrammable EEPROM 23 used for a data memory or the like, etc. The CPU 20 is basically configured such that a program for realizing an SIM (Subscriber Identity Module) function is retained in the mask ROM 21. The SIM function is defined as a control function such as a communication protocol, a subscriber authentication process or the like. As to its details, standards based on GSM 11.14 and ETSI TS 101 267 V8.3.0 (2000-08) or the like are taken into consideration. The CPU 20 is also capable of retaining a program for realizing a USIM function or a program for realizing a Plug-in UICC function where it adapts to the three-generation cellular phone. These programs also have the control function such as the communication protocol, the subscriber authentication process or the like. However, even in the case of telephones different in type in particular, the programs support a communication protocol that enables the use of a common IC card module by its replacement. As to its details, for example, standards based on ETSI TS 102 222 V4.4.0 and ETSI TS 32 102 V4.2.0 or the like are taken into consideration. Incidentally, the microcomputer is not limited to one authenticated by the evaluation/authentication agency of ISO/IEC 15408. The EEPROM 23 can be used not only as a data storing area but also as a program storing area. For example, a Java (registered trademark: same subsequently) virtual machine corresponding to a platform included in the IC card module is stored, thereby enabling conversion and execution of software described by Java byte codes.

Figure 10:
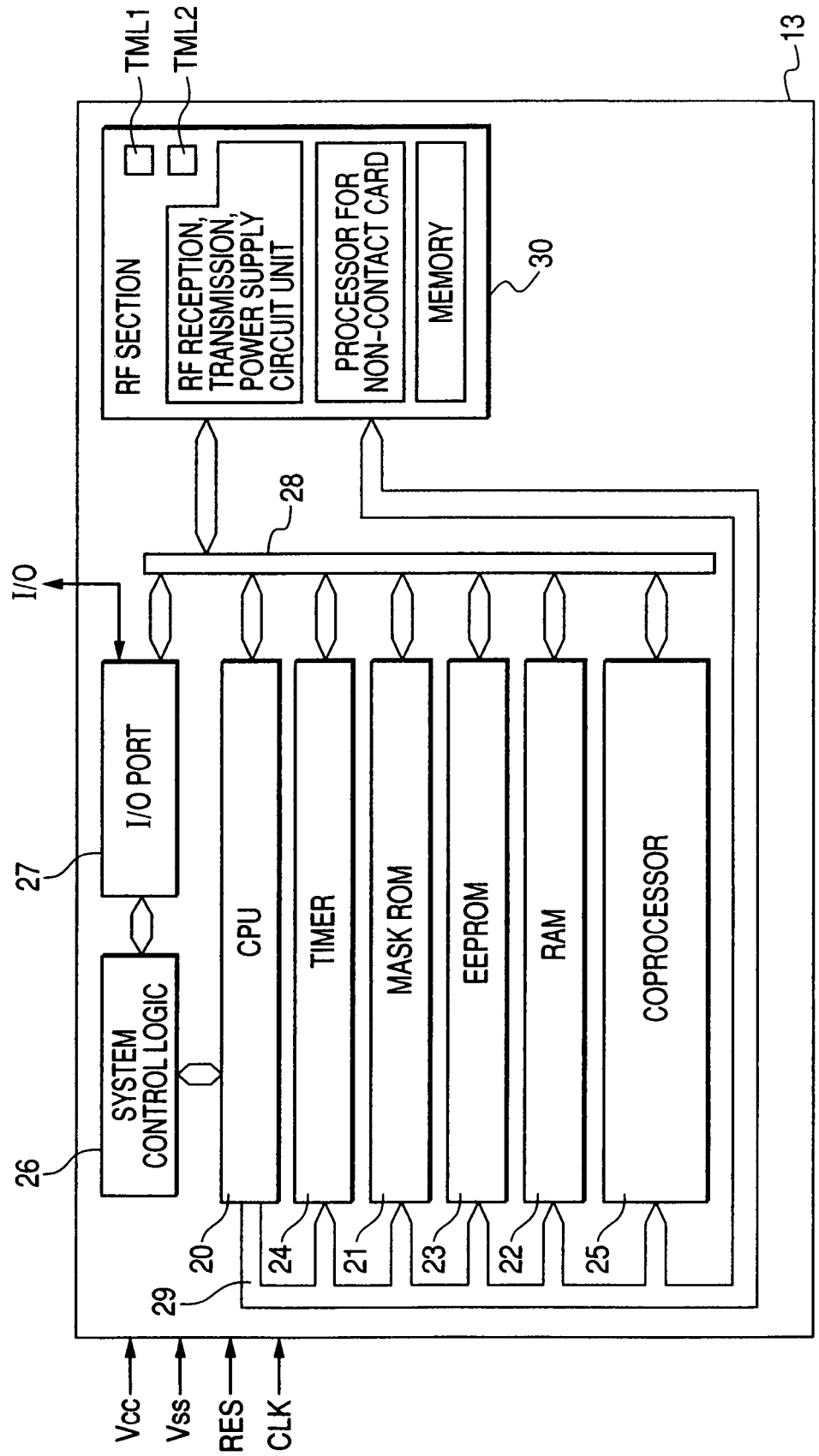
FIG. 10 is a block diagram depicting one example of a microcomputer equipped with an RF section for a non-contact interface.

One example of a microcomputer equipped with an RF section for a non-contact interface is shown in FIG. 10. The microcomputer 13 includes a CPU 20, a RAM (Random Access Memory) 22 used as a work RAM, a timer 24, an EEPROM (Electrically Erasable and Programmable Read Only Memory) 23, a coprocessor unit 25, a mask ROM (Read Only Memory) 21, system control logic 26, an input/output port (I/O port) 27, a data bus 28, an address bus 29 and an RF section 30.

When an IC card command is supplied to the I/O port 27, the system control logic 26 decodes it and allows the CPU 20 to execute a processing program necessary to execute the command. That is, the CPU 20 obtains access to the mask ROM 21 in accordance with an address instructed from the system control logic 26 to fetch an instruction. Further, the CPU 20 decodes the fetched instruction and performs an operand fetch and a data arithmetic operation, based on the result of decoding. The coprocessor unit 25 performs RSA, a surplus computing process at an elliptic curve cryptographic computation in accordance with the control of the CPU 20. The I/O port 27 has a 1-bit input/output terminal I/O and is shared between the input/output of data and the input of an external interrupt signal. The I/O port 27 is coupled to the data bus 28 to which the CPU 20, RAM 22, timer 24, EEPROM 23 and coprocessor unit 25 or the like are connected. The system control logic 26 performs control on each operation mode of the microcomputer 13 and interrupt control thereof, etc. When a reset operation is instructed in accordance with a reset signal RES, the microcomputer 13 is internally initialized so that the CPU 20 starts to execute an instruction from the leading address of the program of the mask RM 21. The microcomputer 13 is operated in sync with a clock signal CLK.

The microcomputer 13 supports one or both of a contact interface using each external connecting terminal as an interface with the outside, and a non-contact interface using the antenna. The RF section 30 has antenna terminals TML1 and TML2 connected to their corresponding external antenna. When the non-contact interface is selected via an internal bus by the system control logic 26, the RF section 30 generates an operating power supply, based on an inductive electromotive force produced by allowing the antenna to cut across a predetermined electromagnetic wave (e.g., high-frequency variable magnetic flux or microwave). Then, the RF section 30 generates an internal clock signal CLK and a reset signal RES on the basis of an induction current produced corresponding to the frequency of the predetermined radio wave, reproduces data superimposed on the predetermined radio wave, and performs the input/output of information from and to the antenna in non-contact form. Inside the microcomputer 13, the RF section 30 operated via the non-contact interface may preferably be constituted of a small-scale circuit independent of the CPU 20 or the like for the operation of the IC card operated via the contact interface. As the RF section 30, there are provided thereinside circuits necessary for non-contact card operations, e.g., a processor for a non-contact card, a memory used in a control program area and a work area of the processor, and an RF transmission/reception and power supply circuit unit. Thus, the RF section 30 is constituted of the independent small-scale circuit as in the case of a processor function and its control program. Therefore, the RF section 30 is capable of easily operating the circuits in accordance with the external inductive electromotive force even in the environment under which the supply of power via a contact terminal is not obtained, for example. The RF section 30 is also capable of performing the input/output of data between a non-contact interface section and a contact interface section via the internal data bus 28 and address bus 29.

The antenna terminals TML1 and TML2 of the RF section 30 are connected to their corresponding non-contact interface antenna terminals (RFA and RFB) assigned to the second external connecting terminals 12 within the IC card module 1. Although not shown in the drawing, the specific reserve terminals of the first external connecting terminals 11 may be used with being allocated to the non-contact interface antenna terminals (RFA and RFB).

The memory card controller 14 has a specific memory card interface function, and a memory interface function with respect to the flash memory 15. When, for example, the memory card controller 14 access-controls the flash memory 15 as a file storage, the memory card controller 14 generates a physical address corresponding to an access-targeted logical address (logical sector address) when the access-targeted logical address is instructed by an access command supplied from a card host, and issues a memory access command set in accordance with the specs of the flash memory 15 to the flash memory 15 to access-control the flash memory 15.

<<Assembly Structure of IC Card Module>>

Figure 11:
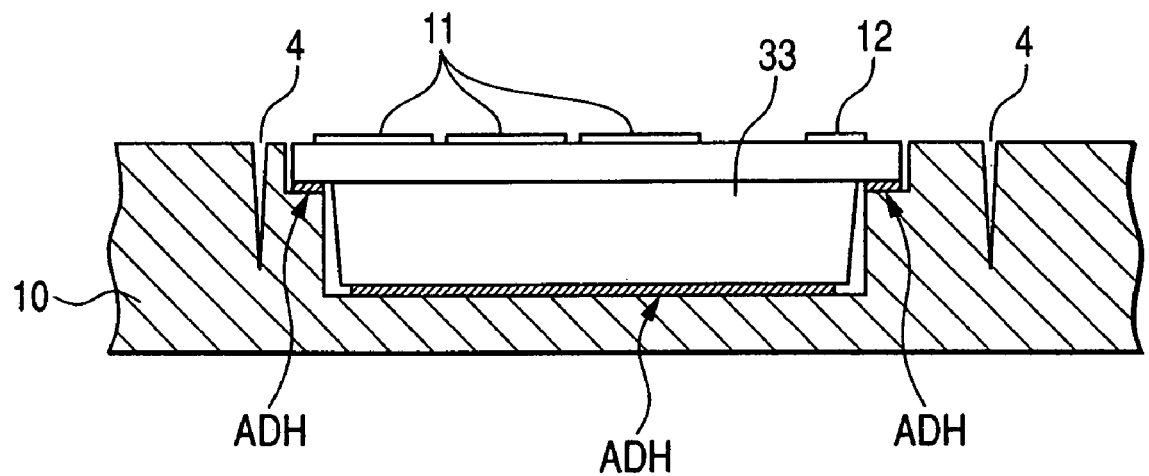
FIG. 11 is a cross-sectional view taken along line XI-XI of FIG. 2.
Figure 12:
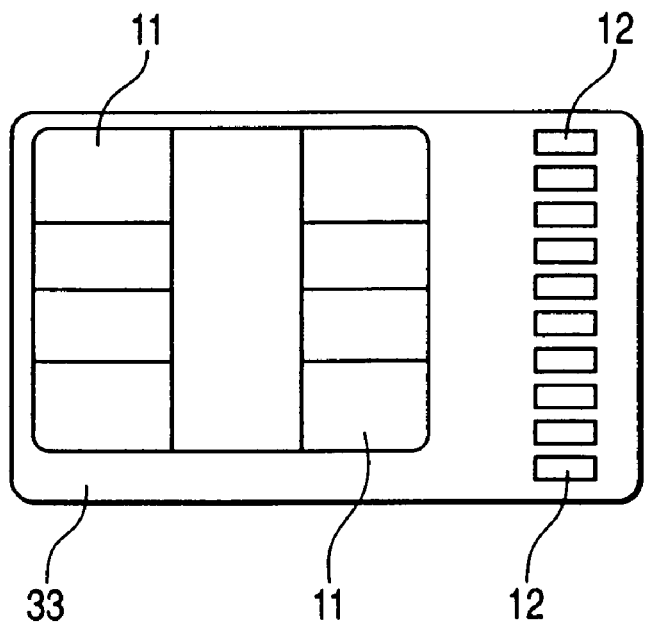
FIG. 12 is a plan view showing a COB module.
Figure 13:
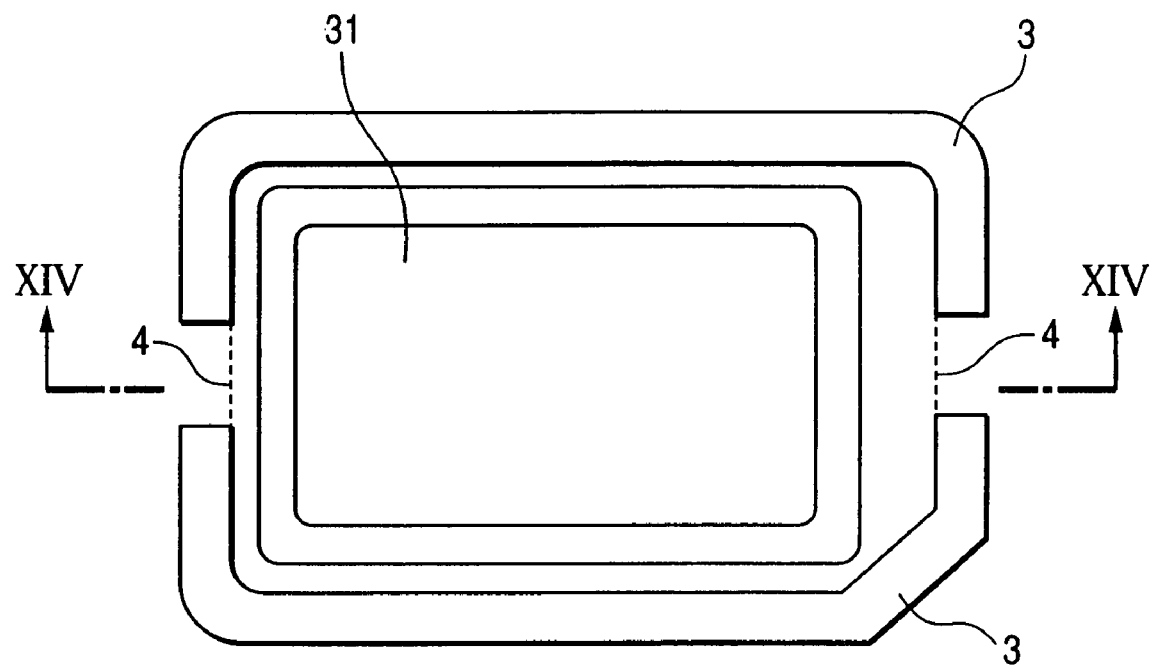
FIG. 13 is a plan view showing a section of incorporation of the COB module into the card substrate.
Figure 14:
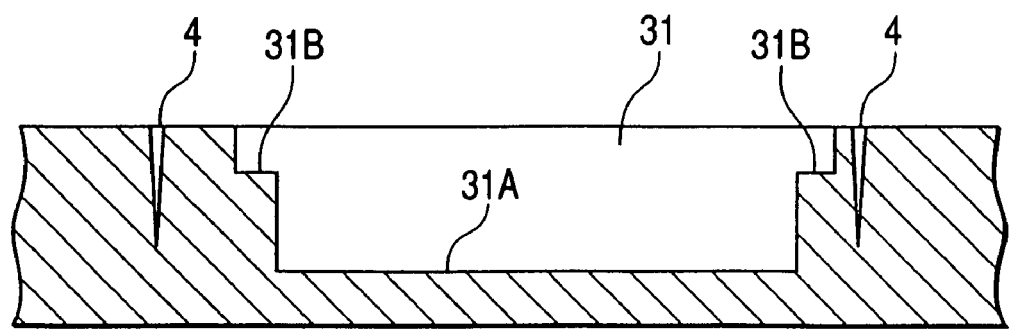
FIG. 14 is a cross-sectional view taken along XIV-XIV of FIG. 13.

The IC card module 1 is configured in such a manner that a COB (Chip On Board) 33 is assembled or incorporated into the card substrate 10 shown in FIGS. 1 and 2. A cross-sectional view taken along line XI-XI of FIG. 2 is shown in FIG. 11. The COB module 33 is constituted by mounting a semiconductor bare chip onto an assembly board and molding its surface with a sealing or encapsulating resin. Its details will be described later. A plan view of the COB module 33 is shown in FIG. 12. An assembly or built-in section 31 of the COB module 33 at the card substrate 10 is shown in FIG. 13 on a plane basis. FIG. 14 is a cross-sectional view taken along line XIV-XIV of FIG. 13. The built-in section 31 of the COB module 33 is configured in such a manner that a deep cavity is formed in a shallow cavity and portions with steps are provided in its mid course. The half-cut portions 4 are constituted of V grooves. As shown in FIG. 11, the COB module 33 is fixed to a bottom portion 31A of the deep cavity of the built-in section 31 and a stepped portion 31B of the shallow cavity thereof with adhesives ADH.

Figure 15:
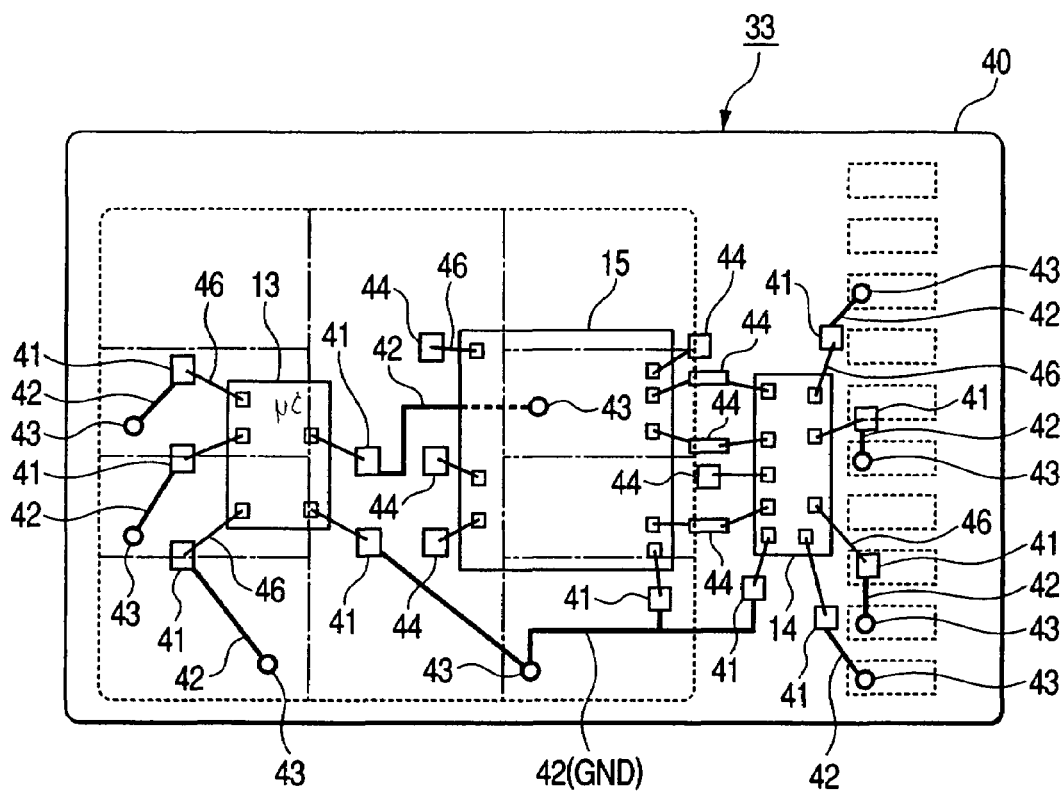
FIG. 15 is a plan view showing a first example of a chip packaged form of the COB module as viewed from the chip mounting surface side.
Figure 16:
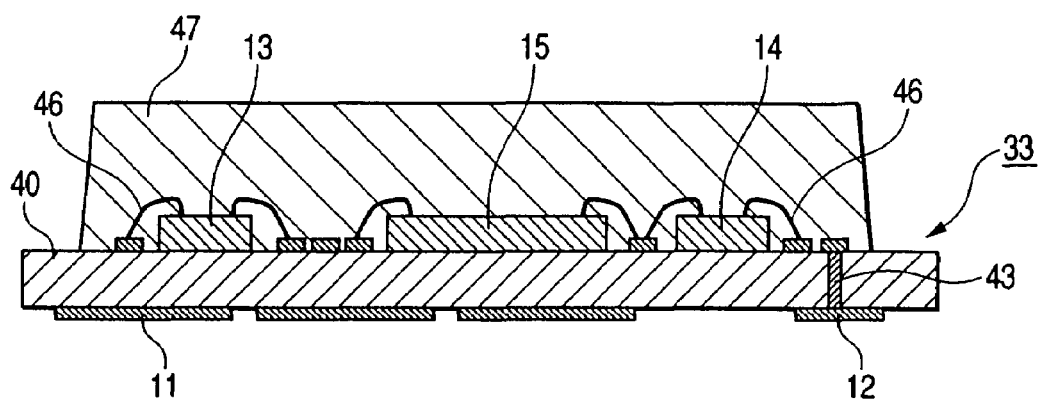
FIG. 16 is a vertical cross-sectional view of FIG. 15.

A first example of a chip packaged form of the COB module 33 as viewed from the chip mounting surface side is shown in FIG. 15. A vertical cross-section of FIG. 15 is schematically shown in FIG. 16. In the same drawing, a microcomputer 13, a memory card controller 14 and a flash memory 15 are respectively configured as separate semiconductor bare chips and adhered and fixed to an assembly board 40 in a flat-placement state. Conductive patterns for the first external connecting terminals 11 and second external connecting terminals 12 are formed in one surface (back surface of FIG. 15) of the assembly board 40. The shapes of these first external connecting terminals 11 and second external connecting terminals 12 are indicated by broken lines in FIG. 15. Bonding leads 41, lead wires 42, through holes 43 and bonding pads 44 respectively typically shown are formed in the other surface (surface of FIG. 15) of the assembly board 40. The through holes 43 connect the lead wires 42 to their corresponding first external connecting electrodes 11 or second external connecting electrodes 12. The lead wires 42 are connected to their corresponding bonding leads 41. The bonding leads 41 are connected to their corresponding bonding pads of the semiconductor bare chips 13, 14 and 15 by bonding wires 46. The lead wire 42 (GND) is configured as a ground wiring shared among the semiconductor chips 13, 14 and 15. The bonding pads 44 are used to connect between the memory card controller 14 and the flash memory 15, for example. The mounting surface sides of the bare chips 13, 14 and 15 at the COB module 33 are molded with a sealing resin 47 over their entirety. Incidentally, only the typical connecting paths are shown in FIG. 15, and connecting paths similar to them are omitted from the drawings.

As a method for manufacturing the COB module 33, a batch molding method may also be adopted. When the batch molding method is adopted, the entirety of the other surface of the assembly board 40 might be brought into such a shape that it is covered with a sealing resin. In such a case, it is also effective to change the shape of the built-in section 31 according to the shape of the sealing resin.

The method for connecting the respective semiconductor chips is not limited to such a case that they are connected via the bonding wires 46. They may be connected by performing flip-chip bonding via protruded electrodes.

Figure 17:
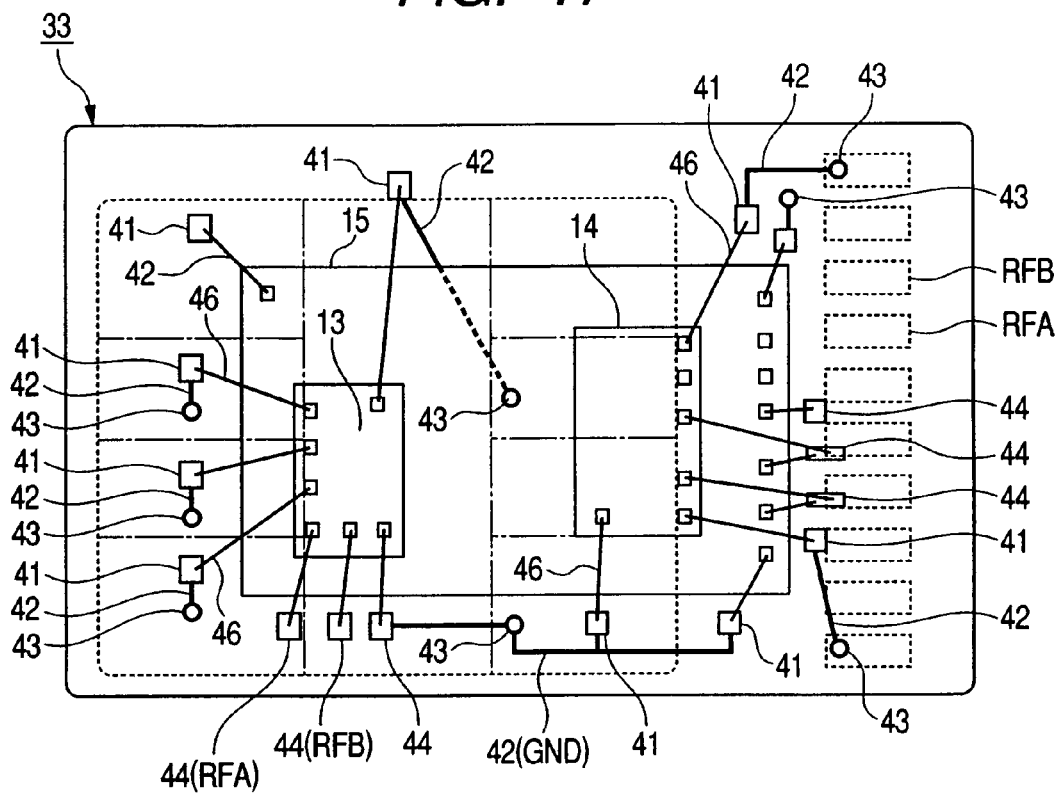
FIG. 17 is a plan view showing a second example of a chip packaged form of the COB module as viewed from the chip mounting surface side.
Figure 18:
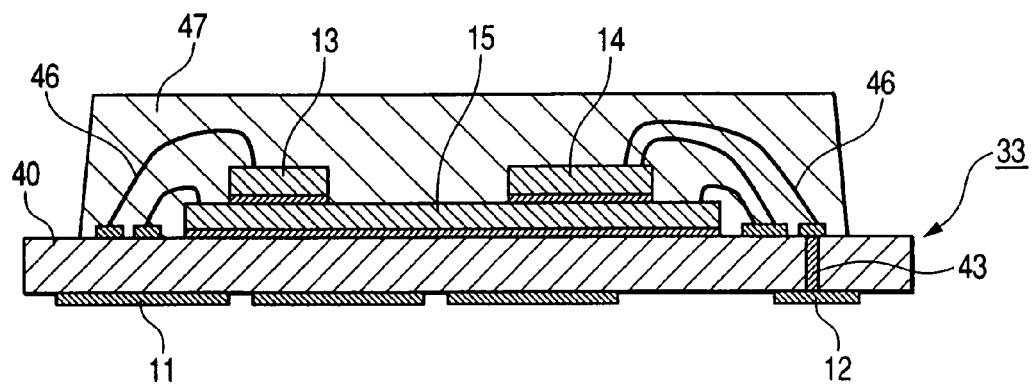
FIG. 18 is a vertical cross-sectional view of FIG. 17.

A second example of a chip packaged form of the COB module 33 as viewed from the chip mounting surface side is shown in FIG. 17. A vertical cross-section of FIG. 17 is schematically shown in FIG. 18. In the same drawing, a microcomputer 13, a memory card controller 14 and a flash memory 15 are respectively configured as separate semiconductor bare chips. The flash memory 15 is adhered and fixed to an assembly board 40. The microcomputer 13 and memory card controller 14 are stacked over the flash memory 15 and adhered and fixed thereto. Conductive patterns for the first external connecting terminals 11 and second external connecting terminals 12 are formed in one surface (back surface of FIG. 17) of the assembly board 40. Bonding leads 41, lead wires 42, through holes 43 and bonding pads 44 respectively typically shown are formed in the other surface (surface of FIG. 17) of the assembly board 40. The through holes 43 connect the lead wires 42 to their corresponding first external connecting electrodes 11 or second external connecting electrodes 12. The lead wires 42 are connected to their corresponding bonding leads 41. The bonding leads 41 are connected to their corresponding bonding pads of the semiconductor bare chips 13, 14 and 15 by bonding wires 46. The lead wire 42 (GND) is configured as a ground wiring shared among the semiconductor chips 13, 14 and 15. The bonding pads 44 are used to connect between the memory card controller 14 and the flash memory 15, for example. In FIG. 17, the bonding pads 44 (RFA) and 44 (RFB) are connected to their corresponding non-contact interface antenna terminals RFA and RFB assigned to some of the second external connecting terminals 12. Connections between the bonding pads 44 (RFA) and 44 (RFB) and antenna terminals RFA and RFB may be done via wirings, bonding pads and bonding wires not shown on the assembly board 40. The mounting surface sides of the bare chips 13, 14 and 15 at the COB module 33 are molded with a sealing resin 47 over their entirety. Incidentally, only the typical connecting paths are shown in FIG. 17, and connecting paths similar to them are omitted from the drawings.

When the non-contact interface antenna terminals RFA and RFB are assigned to their corresponding reserve terminals of the first external connecting terminals 11, the bonding pads 44 (RFA) and 44 (RFB) may be connected to their corresponding non-contact interface antenna terminals RFA and RFB assigned to the reserve terminals of the first external connecting terminals 11. Upon their connections, wirings are led out from the bonding pads 44 (RFA) and 44 (RFB) and may be connected to their corresponding non-contact interface antenna terminals RFA and RFB via through holes.

Figure 19:
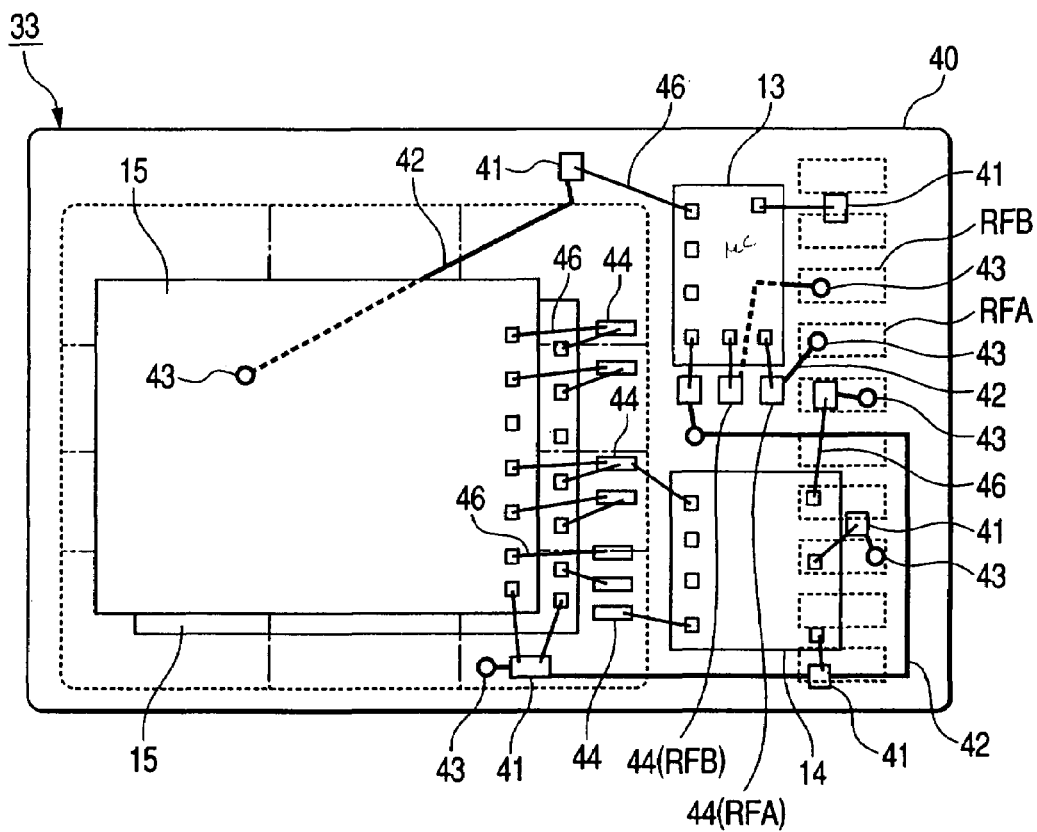
FIG. 19 is a plan view showing a third example of a chip packaged form of the COB module as viewed from the chip mounting surface side.
Figure 20:
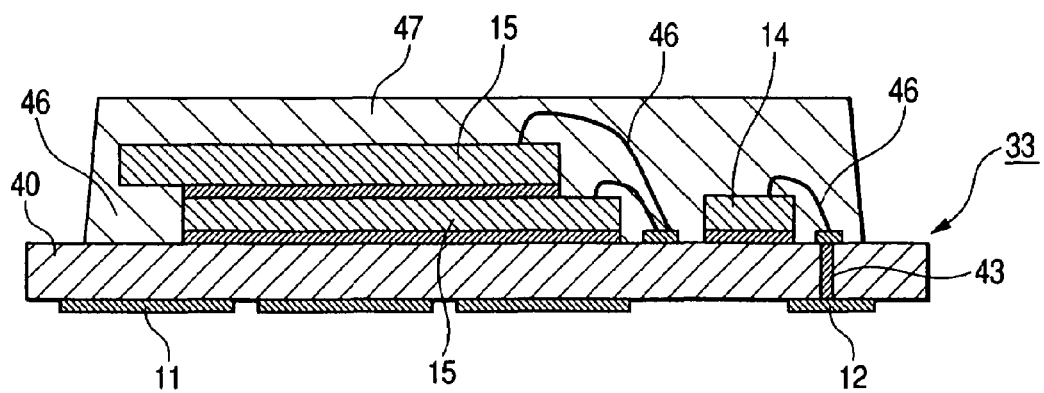
FIG. 20 is a vertical cross-sectional view of FIG. 19.

A third example of a chip packaged form of the COB module 33 as viewed from the chip mounting surface side is shown in FIG. 19. A vertical cross-section of FIG. 19 is schematically shown in FIG. 20. In the same drawing, a microcomputer 13, a memory card controller 14 and flash memories 15 are respectively configured as discrete semiconductor bare chips. The stacked two flash memories 15, the microcomputer 13 and the memory card controller 14 are respectively adhered and fixed to an assembly board 40. As compared with FIG. 17, the shapes, layouts and the like of bonding leads 41, lead wires 42, through holes 43 and bonding pads 44 differ according to the differences among the layouts of the flash memories 15, microcomputer 13 and memory card controller 14 on the assembly board 40. In FIG. 19, the bonding pads 44 (RFA) and 44 (RFB) are connected to their corresponding non-contact interface antenna terminals RFA and RFB assigned to some to the second external connecting terminals 12. Other configurations are similar to FIG. 17.

According to the IC card module described above, the following operations and advantageous effects can be obtained.

[1] Since both the first and second external connecting terminals 11 and 12 which perform an external interface between the microcomputer 13 and the memory card controller 14, are formed in one surface of the memory card 1, there is no need to form the card substrate 10 by a complicated multilayer wiring board. It is thus possible to hold down the cost of the card substrate 10. When the external connecting terminals, which respectively meet the standard, are formed in the obverse and reverse sides of the card substrate 10, the cost thereof rises.

[2] Since the shape of the card substrate 10 and the layout of the first external connecting terminals 11 are based on the standard of plug-in UICC at ETSI TS 102 221 V4.4.0 (2001-10) or have compatibility, the external connecting terminals 11 of the microcomputer 13 have arrangements and sizes similar to the SIM card and are easy to take compatibility with the SIM card in widespread use. Since the external connecting terminals 11 of the microcomputer 13 are not scaled down with respect to the standard of the SIM card, they contribute to high reliability of data processing by the microcomputer 13 in terms of contact conditions of the interface terminals. This is because there is a fear that if the areas thereof are reduced, the contact conditions are degraded.

[3] The second external connecting terminals 12 are disposed outside the minimum range for terminal layout, based on the standard for the first external connecting terminals 11. It is therefore assured to avoid the second external connecting terminals 12 from contacting the terminals of the card socket for the SIM card. In this respect, the compatibility with the SIM card can be assured. The above standard defines the minimum area for each first external connecting terminal 11. According to it, it is essential that the terminals of the card socket are able to have such layouts that they are contactable with the card terminals within the minimum area.

[4] The first external connecting terminals 11 and the second external connecting terminals 12 are electrically separated from one another in terms of the signal terminals. Even in this respect, the compatibility with the SIM card can be assured. If the signal terminals of the first external connecting terminals 11 and the second external connecting terminals 12 are electrically separated from one another, it is then possible to minimize the fear that the memory card controller 14 exerts a bad influence on a terminal such as a cellular phone capable of adapting to only the SIM card with no memory interface function.

[5] The number of terminals used in the input/output of data, of the second external connecting terminals 12 is set larger than the number of terminals used in the input/output of data, of the first external connecting terminals 11. Thus, it becomes easier to set the data transfer speed related to the memory card function larger than the data transfer speed related to the IC card function.

[6] From the above, the second external connecting terminals 12 are estimated to be reduced with respect to the memory card standard of an MMC or the like. If it is considered that the microcomputer 13 is used in security processing, it is essential to allow the microcomputer 13 to meet satisfactory contact conditions in terms of reliability of the processing as mentioned above. In the case of a memory access, however, a necessary data storage function can be realized by making combined use of an error correction by ECC or the like, a retry access, etc. The idea that it is advisable to reduce the second external connecting terminals 12 which perform the external interface of the memory card controller 14, with respect to the corresponding memory card standard in that the number of parallel access data bits is increased to enable a high-speed access or allow of it, is given priority over the above.

<<Realization of MC-EX (Mobile Commerce Extension) Function>>

A description will next be made of a construction for making it possible to utilize an IC card module ranked as a function extension card for an SIM card in terms of a memory card whose security function is extended. The security function mentioned herein is to realize security processing accompanied with authentication and accounting for mobile commerce, for example. The security function intends to mount a microcomputer for an IC card to a memory card such as an MMC as a security controller and perform an interface with the outside by means of a memory card interface set in conformity with the standard of the memory card. Such an extension function relative to the memory card is generally called MC-EX function.

Figure 21:
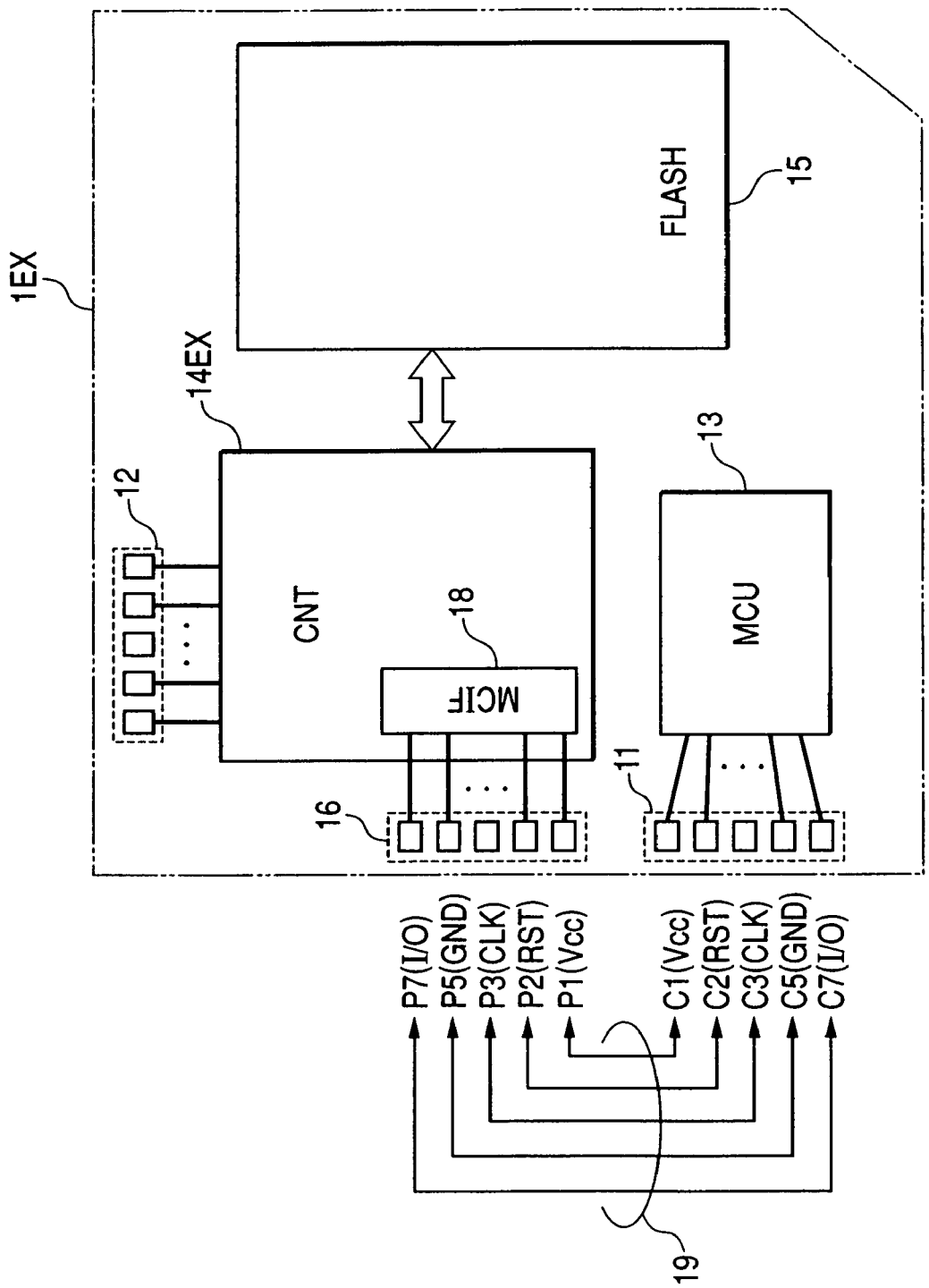
FIG. 21 is a block diagram illustrating an IC card module in which an MC-EX function has been realized.

FIG. 21 shows an IC card module 1EX in which the MC-EX function is realized. Points of difference between the present IC card module 1EX and the above IC card module 1 are as follows. Firstly, a memory card controller 14EX is provided with a microcomputer interface circuit (MCIF) 18 for interfacing with a microcomputer 13 and has a security processing function using the microcomputer 13. Secondly, the card substrate 10 has third external connecting terminals 16 connected to the microcomputer interface circuit.

The microcomputer interface circuit 18 issues an operation command to the microcomputer 13 in response to a predetermined memory card command and accepts a response corresponding to its command. The first external connecting terminals 11 and the third external connecting terminals 16 are connected to one another by connectors and wirings 19 lying within a card slot. Further, the second external connecting terminal 12 are connected to a memory card host. Consequently, the IC card module 1EX functions as a memory card such as an MMC or the like capable of external interface, which is set in conformity with memory card interface specs. If the third external connecting terminals 16 are held floating within the card slot, then a host computer is capable of performing an interface to the microcomputer 13 via the first external connecting terminals 11 and carrying out a memory card interface via the second external connecting terminals 12, and functions as an IC card such as a plug-in UICC card.

As the construction of the IC card module 1EX, for example, a Java virtual machine corresponding to a platform included in the microcomputer 13 can be stored in its corresponding flash memory 15.

When, for example, the Java virtual machine is stored in the flash memory 15, software described in Java byte-code is converted into a native-code by using the Java virtual machine, which is then executed. A result executed by the Java virtual machine is transferred to the microcomputer 13 via the microcomputer interface circuit 18 in the form of data or an instruction command, where security processing accompanied with authentication and accounting for mobile commerce, for example, is executed using the security function of the microcomputer 13.

No limitation is imposed on the above example. Software for generating data or an instruction command to be transferred to the microcomputer 13 is stored in the flash memory 15, and the data or instruction command generated by the software can be transferred via the microcomputer interface circuit 18 used as the interface between the microcomputer 13 and the memory card controller 14EX. By storing the software used in conjunction with the microcomputer 13 in the mass or high-capacity flash memory 15 in this way, it becomes easy to store larger scale software. Such a construction is very effective in that when the IC card module 1EX is used to realize various functions, the degree of freedom of capacity with respect to a program to be stored can be enhanced.

In the present embodiment, the microcomputer 13, memory card controller 14EX and microcomputer interface circuit 18 can also be formed on one semiconductor chip. With a view toward performing an improvement in data transfer speed via the microcomputer interface circuit 18 and ensuring data security in particular, these circuits may preferably be formed on one semiconductor chip.

Although the present embodiment has described the construction in which the first external connecting terminals 11 and the third external connecting terminals 16 are connected by the connectors and wirings 19 lying within the card slot, the form of connections between the first external connecting terminals 11 and the third external connecting terminals 16 is not limited to it. When, for example, the microcomputer 13 and the microcomputer interface circuit 18 are formed on one semiconductor chip, the connections between the microcomputer 13 and the microcomputer interface circuit 18 can be configured by wirings formed on the semiconductor chip. In this case, the microcomputer 13 or the memory card controller 14EX or both may be configured so as to connect to the first external connecting terminals 11 without providing the third external connecting terminals 16.

Although the present embodiment has also described the case in which the interface to the outside with the security processing accompanied with the authentication and accounting for mobile commerce is performed by the memory card interface set in conformity to the standard of the memory card, the present invention is not limited to the embodiment. Of course, it is also possible to utilize an IC card interface as the interface to the outside with the security processing.

The first external connecting terminals 11 are of the power supply terminal Vcc, reset signal input terminal RST, clock input terminal CLK, ground terminal GND, and data input/output I/O, the third external connecting terminals 16 correspond to them and are configured as a power supply terminal Vcc, a reset signal output terminal RST, a clock output terminal CLK, a ground terminal GND, and a data input/output I/O.

Figure 22:
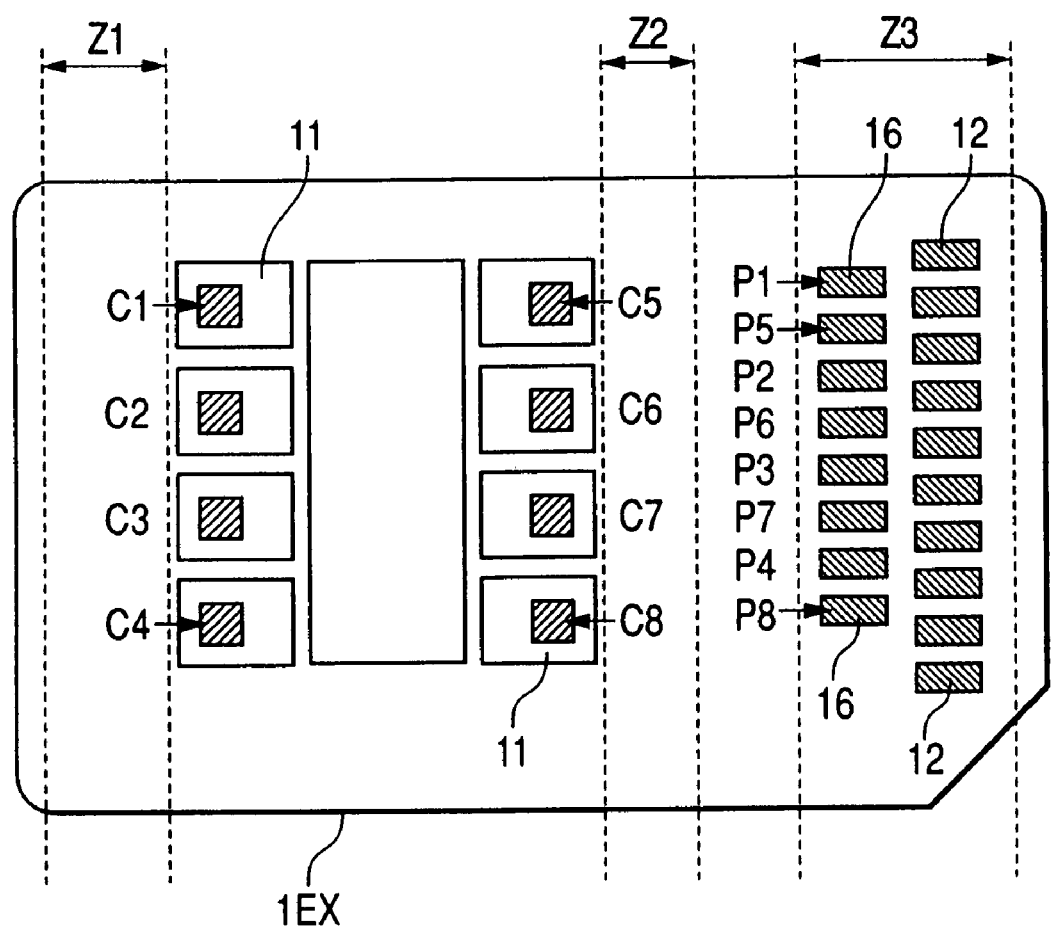
FIG. 22 is an explanatory diagram showing a layout example of third external connecting terminals.

An example illustrative of the layout of third external connecting terminals 16 is shown in FIG. 22. For example, back-row terminals P1 through P8 in a Z3 area can be configured as the third external connecting terminals 16 corresponding to C1 through C8 respectively. At this time, C1 indicates a power supply terminal Vcc, C4 indicates a reserve terminal, C5 indicates a ground terminal GNG, and C8 indicates a reserve terminal, respectively. If the power supply and ground for the microcomputer 13 and the memory card controller 14EX are connected in common within the card substrate 10, then the terminals P1 and P5 corresponding to them can be omitted from the third external connecting terminals 16. Similarly, the reserve terminals P4 and P8 can also be omitted from the third external connecting terminals 16. It is also possible to dispose P1 through P4 in a Z1 area and place P5 through P8 in a Z2 area. By placing the terminals P1 through P8 in areas adjacent to their corresponding terminals C1 through C8 in this way, the connections among the P1 through P8 and C1 through C8 are configured easier by the connectors and wirings 19 in the card slot.

One example of a command processing function of the memory card controller 14EX will now be explained. The memory card controller 14EX receives a command access to an IC card and a command for executing security processing to the IC card, in addition to a standard memory card command (command for obtaining access to a flash memory chip) through the second external connecting terminals 12. The memory card controller 14EX selects an object to be controlled, according to whether the received command corresponds to the standard memory card command or the command for executing the security processing. In the present example, when the standard memory card command is received, the memory card controller 14EX access-controls the flash memory 15 and issues a flash memory command to the flash memory 15 to perform read/write or the like of data. On the other hand, when the command to the IC card and the command for executing the security processing to the IC card are received, the memory card controller 14EX issues an IC card command to the microcomputer 13 to allow it to execute instruction processing and the security processing.

The standard memory card command based on the MMC has, for example, a command field of 6 bytes of which the leading 1 byte is defined as a command code (leading 2 bits are fixed to "01"), the 4 bytes lying in mid course is defined as an argument used for parameter designation or the like, and the final 1 byte is defined as CRC (Cyclic Redundancy Check). The command for the security processing is realized by an IC card access command. Described specifically, a CMD 6 is issued as transition to a secure mode in the MMC, and after issuance of a CMD 52, a command for the IC card is transmitted and its transmission is stopped by a CMD 12. Thus, the command is transmitted to the IC card through the memory card controller. The IC card microcomputer having received the command performs secure processing and sends a response back to the memory card controller. A CMD 52 is issued to receive the response at the memory card interface. After reception of the response, a read instruction is stopped in accordance with the CMD 12. It is possible to perform transmission/reception of the command from the memory card interface to the IC card in this way. The transmit command CMD52 and the receipt command CMD51 are shown by way of example.

Figure 23:
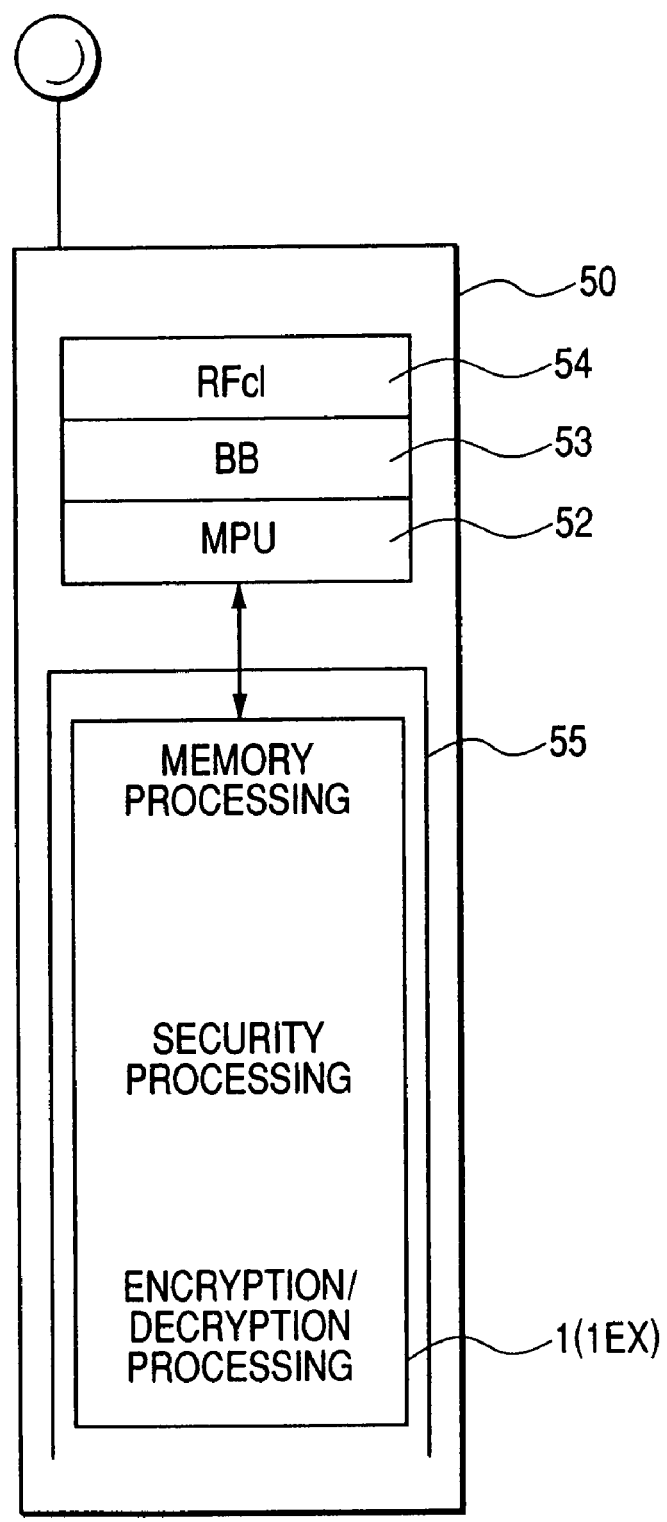
FIG. 23 is a block diagram showing a cellular phone to which an IC card module is mounted.

A cellular phone mountably provided with the IC card module is shown in FIG. 23. The cellular phone 50 has, for example, a microprocessor (MPU) 52 which controls the entire system, a baseband processor (BB) 53 which performs baseband processing such as modulation and demodulation for the purpose of mobile communications, a high frequency section (RFc1) 54 which performs transmission/reception based on a prescribed high frequency, and a card socket 55. The IC card module 1 or 1EX is detachably mounted to the card socket 55. The card socket 55 is provided with terminals that contact external connecting terminals of the mounted IC card module 1 or 1EX. The MPU 52 is ranked as a card host for the IC card module 1 or 1EX. The IC card module 1 or 1EX provides a multifunction such as a memory processing function, a high-level security processing function relative to E-commerce or the like, a low-level security processing function for accounting or the like at public transport, a processing function for encryption/decryption of content data, etc.

While the invention made above by the present inventors has been described specifically on the basis of the preferred embodiments, the present invention is not limited to the embodiments referred to above. It is needless to say that various changes can be made thereto without the scope not departing from the gist thereof.

For example, the memory card function mounted to the IC card module is not limited to the MMC card but may be adapted to a memory card having other specs. The numbers of the first, second and third external connecting terminals and their functions are not limited to the above description but can suitably be changed. In FIG. 22, the terminals of P1 through P8 are not limited to the use form employed in the connection with the memory card controller but may be used for external interface terminals at the time that an IC card microcomputer different from the microcomputer connected to C1 through C8 is added and mounted. Further, they may be used as interface terminals at the time that other memory card controller and flash memory are mounted. For example, a memory card function is provided which satisfies interface specs of both an MMC card and a memory stick card. The microcomputer, the memory card controller and the flash memory are not limited to the discrete chips respectively. It is also possible to configure the microcomputer and the memory card controller by one chip, configure the memory card controller and the flash memory by one chip and configure the whole by one chip.

What is claimed is:
1. An IC card module comprising:
a substrate having a first surface and a second surface opposite to the first surface;
a plurality of first external connecting terminals and a plurality of second external connecting terminals both exposed to the first surface of the substrate;
a flash memory chip disposed on the second surface of the substrate and having a plurality of first pads;
a controller chip for controlling the flash memory chip disposed on a surface of the flash memory chip and having a plurality of second pads, the second pads elec- trically connected to the second external connecting terminals and the first pads; and a microcomputer chip disposed on said surface of the flash memory chip and having a plurality of third pads, the third pads electrically connected to the first external connecting terminals;

wherein the flash memory is a rectangular shape and has a pair of first and second sides, wherein the controller chip is disposed along the first side of the flash memory, and wherein the microcomputer chip is disposed along the second side of the flash memory.

2. An IC card module according to claim 1, wherein the first pads are disposed along the first side of the flash memory.

3. An IC card module according to claim 2, wherein the third pads are disposed along the second side of the flash memory.

4. An IC card module according to claim 3, wherein a shape of the IC card module and a layout of the first external connecting terminals are based on a standard of plug-in UTCC (Universal Integrated Circuit Card) at ETSI TS (European Telecommunications Standardization Institute Technical Specification)102 221 V4.4.0 (2001-10), wherein the second external connecting terminals are disposed outside a minimum range of the terminal layout based on the standard for the first external connecting terminals, wherein the first external connecting terminals and the second external connecting terminals respectively include signal terminals electrically separated from one another.

5. An IC card module according to claim 4, wherein the microcomputer chip, first flash memory chip and controller chip are molded by a resin.

6. An IC card module according to claim 1, wherein the IC card module is based on an outer shape of an ID-1 type card standard of ISO/IEC 7816-1 or separately formed within a card having compatibility.

7. An IC card module according to claim 1, wherein the microcomputer chip has a program which realizes a SIM (Subscriber Identity Module) function.

8. An IC card module according to claim 1, wherein the microcomputer chip has a program which realizes a USIM (Universal Subscriber Identity Module) function.

9. An IC card module according to claim 1, wherein the microcomputer chip has a program which realizes a plug-in UICC function.

10. An IC card module according to claim 1, wherein the microcomputer chip is authenticated by an evaluation/authentication agency of ISO/IEC 15408.

11. An IC card module according to claim 1, wherein the controller chip has a memory card interface function based on a predetermined memory card standard.

12. An IC card module according to claim 1, wherein the first external connecting terminals include a power supply terminal, a ground terminal, a reset terminal, a clock terminal, and an input/output terminal, wherein the second external connecting terminals include a power supply terminal, a clock terminal, a command terminal, and a data terminal of 1 bit or data terminals of plural bits, and wherein the second external connecting terminals are respectively set smaller than the first external connecting terminals.

13. An IC card module according to claim 1, wherein the microcomputer chip has non-contact interface portions, and the non-contact interface portions are connected to terminals defined as reserve terminals of the first external connecting terminals and are configured as antenna terminals.

14. An IC card module according to claim 1, wherein the microcomputer chip has noncontact interface portions, and the noncontact interface portions are connected to predetermined terminals of the second external connecting terminals and configured as antenna terminals.

15. An IC card module according to claim 1, wherein a semiconductor chip constituting a non-volatile memory has a layout in which the semiconductor chip is superimposed over the first external connecting terminals.

16. An IC card module according to claim 1, wherein the controller chip has a microcomputer interface circuit which issues an operation command to the microcomputer chip in response to a predetermined memory card command and receives a response corresponding to the operation command, and wherein the card substrate further includes third external connecting terminals connected to the microcomputer interface circuit.

17. An IC card module according to claim 1, wherein the IC card module is detachably mounted to a portable terminal device, wherein the portable terminal device comprises:

first interface terminals which contact the first external connecting terminals respectively;

second interface terminals which contact the second external connecting terminals respectively; and a data processor connected to the first and second interface terminals.

18. An IC card module according to claim 17, wherein the portable terminal device further comprises a high frequency section connected to the data processor.

19. An IC card module according to claim 1, wherein the number of the terminals used in the input/output of data, of the second external connecting terminals is larger than the number of the terminals used in the input/output of data, of the first external connecting terminals.

20. An IC card module according to claim 19, wherein the terminals used in the input/output of data, of the second external connecting terminals are smaller than the terminals used in the input/output of data, of the first external connecting terminals respectively.

21. An IC card module according to claim 1, wherein the microcomputer stores a Java (registered trademark) virtual machine therein.

* * * * *